(12) United States Patent
Somers et al.

(10) Patent No.: US 12,411,222 B1
(45) Date of Patent: Sep. 9, 2025

(54) APPARATUSES, SYSTEMS, AND METHODS FOR REAL-TIME SIGNAL DETECTION AND CLASSIFICATION

(71) Applicant: SATSS LLC, Ashburn, VA (US)

(72) Inventors: William John Somers, Ashburn, VA (US); Dylan Metzger, Herndon, VA (US); Suhaib Tahir, Reston, VA (US); Tracey Fischer, Arlington, VA (US); Alex Walker, Herndon, VA (US); Michael DiBerardino, Herndon, VA (US); Brice Landry, Castle Rock, CO (US); Michael Hansen, Reston, VA (US); Eric Cho, Centreville, VA (US)

(73) Assignee: SATSS, LLC, Ashburn, VA (US)

( * ) Notice: Subject to any disclaimer, the term of this patent is extended or adjusted under 35 U.S.C. 154(b) by 0 days.

(21) Appl. No.: 19/028,658

(22) Filed: Jan. 17, 2025

(51) Int. Cl.
*G01S 13/02* (2006.01)
*G06F 17/14* (2006.01)
*H03M 1/12* (2006.01)

(52) U.S. Cl.
CPC ........ *G01S 13/0209* (2013.01); *G06F 17/142* (2013.01); *H03M 1/12* (2013.01)

(58) Field of Classification Search
CPC ..... G01S 13/0209; G06F 17/142; H03M 1/12
See application file for complete search history.

(56) References Cited

U.S. PATENT DOCUMENTS

| | | | |
|---|---|---|---|
| 6,898,235 B1 * | 5/2005 | Carlin | H04B 1/001 342/147 |
| 7,356,075 B2 | 4/2008 | Bergstrom et al. | |
| 10,371,732 B2 | 8/2019 | Al-Adnani | |
| 10,411,810 B2 | 9/2019 | Kuo et al. | |
| 10,523,329 B2 | 12/2019 | Esman et al. | |
| 10,623,215 B2 * | 4/2020 | Anthony | H04L 12/4633 |
| 11,378,673 B2 | 7/2022 | Schuck et al. | |
| 11,841,442 B2 | 12/2023 | Cochran et al. | |
| 12,149,948 B2 * | 11/2024 | Montalvo | G06N 5/022 |

* cited by examiner

*Primary Examiner* — Vladimir Magloire
*Assistant Examiner* — Nazra Nur Waheed
(74) *Attorney, Agent, or Firm* — J. Miguel Hernandez; David W. Carstens; Carstens, Allen & Gourley, LLP

(57) ABSTRACT

A system for detecting and identifying signals in real-time. The system includes an antenna for capturing electromagnetic signals, an analog-to-digital converter (ADC) to convert the captured electromagnetic signals into digital signals, a database containing stored signal data, and a processor. The processor performs a Fast Fourier Transform (FFT) on the digital signals to determine energy characteristics of the digital signals and compares the energy characteristics with the stored signal data. The processor buffers the digital signals to produce a buffered digital signal set and channelizes the buffered digital signal set to produce a plurality of buffered digital signal sets. The processor performs a cyclostationary algorithm on the plurality of buffered digital signal sets to detect cyclic characteristics of the digital signals and compares the cyclic characteristics with the stored signal data. The processor identifies digital signals based on the comparisons and displays the identified digital signals.

20 Claims, 16 Drawing Sheets

APPARATUSES, SYSTEMS, AND METHODS FOR REAL-TIME SIGNAL DETECTION AND CLASSIFICATION

CROSS-REFERENCE TO RELATED APPLICATIONS

Not Applicable.

BACKGROUND

Technical Field

The present disclosure relates to electromagnetic spectrum analysis and, more particularly, to real-time ultra-wideband signal processing techniques for the detection, classification, and geolocation of signals.

Description of Related Art

Electromagnetic spectrum (EMS) monitoring involves observing and analyzing the radio frequency (RF) portion of the electromagnetic spectrum. This spectrum encompasses a wide range of frequencies, from low-frequency radio waves to high-frequency X-rays and gamma rays. By monitoring this spectrum, users can detect, identify, and analyze various signals, including those from communication devices, radar systems, and other electronic devices. Currently, EMS monitoring devices cannot readily be utilized in the field because, among other things, they struggle to capture wideband, high-bandwidth signals, as well as bursting narrowband signals. The current technology utilizes software that lacks flexibility, automation, and data processing capabilities. Additionally, the current technology has size, weight, and power limitations, as well as computational requirements, that hinder portability and field deployment of real-time spectrum monitoring systems. Additionally, current cyclostationary techniques cannot be utilized for real-time spectrum monitoring systems because the processing is too computationally taxing on processors. Therefore, a need exists for autonomous, modular EMS monitoring systems that have passive detection and recording capabilities. Additionally, a need exists for portable EMS monitoring systems that capture and accurately identify signals and their sources, determine the precise origin of the signals, and provide real-time results.

BRIEF SUMMARY

This summary provides a discussion of aspects of certain embodiments of the invention. It is not intended to limit the claimed invention or any of the terms in the claims. The summary provides some aspects but there are aspects and embodiments of the invention that are not discussed here.

In one aspect, a system for detecting and identifying signals in real-time is provided. The system can include one or more antennas for capturing electromagnetic signals, an analog-to-digital converter (ADC) in communication with the one or more antennas and configured to convert the captured electromagnetic signals into digital signals, one or more databases comprising stored signal data and/or associated parametrics, and a processor in communication with the ADC and the one or more databases. The digital signals can include IQ data. The processor can be configured to dynamically cause the one or more antennas to incrementally sweep through a predefined frequency range to capture electromagnetic signals. The incremental sweep can include a plurality of bands having a predefined step size, and the incremental sweep can include a predefined dwell time for each band of the plurality of bands. The processor can perform a Fast Fourier Transform (FFT) on the digital signals to determine energy characteristics of the digital signals and compare the energy characteristics with the stored signal data stored in the one or more databases. The processor can also buffer and channelize the IQ data of the digital signals to produce a buffered digital signal set. The IQ data can be buffered for a predefined period of time. The processor can perform a cyclostationary algorithm on the plurality of buffered digital signal sets to detect cyclic characteristics of the digital signals and compare the cyclic characteristics with the stored signal data stored in the one or more databases. The processor can identify digital signals based on the comparisons of the energy characteristics and cyclic characteristics with the stored signal data and display the identified digital signals on a graphic user interface. The digital signals can be buffered for a predefined period of time. Optionally, the digital signals can be buffered in Random Access Memory.

In one embodiment, after performing the FFT on the digital signals, the processor can be configured to display the energy characteristics on the graphic user interface. Additionally, or alternatively, after performing the cyclostationary algorithm on the plurality of buffered digital signal sets, the processor can be configured to detect, identify, and display the cyclic characteristics on the graphic user interface.

In another embodiment, after performing the FFT on the digital signals, the processor can be configured to store the energy samples in the one or more databases. Additionally, or alternatively, after performing the cyclostationary algorithm on the plurality of buffered digital signal sets, the processor is configured to store the cyclic samples in the one or more databases.

In another embodiment, the one or more antennas can be configured to capture samples of radio frequencies between 20 MHz and 43.5 GHz. The one or more antennas can include a directional antenna and an omnidirectional antenna configured for direction finding, and the processor performs a coherent subtraction algorithm to locate signals of interest. The directional antenna can be configured to capture signals of radio frequencies between 250 MHz and 26 GHZ, and the omnidirectional antenna can be configured to capture signals of radio frequencies between 20 MHz and 43.5 GHz. The processor can be configured to execute a coherent subtraction algorithm to locate detected signals. The processor can be configured to subtract the signals captured by the omnidirectional antenna from the signals captured by the directional antenna.

In another embodiment, the processor can be configured to buffer the digital signals, channelize the set of buffered digital signals, perform the cyclostationary algorithm, and compare the cyclic characteristics simultaneously with performing the FFT and comparing the energy characteristics.

In another embodiment, the processor can be further configured to perform a geolocation algorithm to identify a location of the identified signals. The geolocation algorithm can include time-difference-of-arrival geolocation, frequency-difference-of-arrival geolocation, angle of arrival geolocation, Direction Finding, or any combination thereof.

In another embodiment, the energy characteristics and cyclic characteristics can be combined and simultaneously compared with the stored signal data stored in the one or more databases, which can facilitate signal characterization, parameterization, identification, exploitation, or any combination thereof.

In another embodiment, dynamically causing the one or more antennas to incrementally sweep through the predefined frequency range includes automatically determining a dynamic noise floor of the captured electromagnetic signals having radio frequency (RF) activity during an initial sweep. After the initial sweep, the processor is further configured to: (a) perform the cyclostationary algorithm on the plurality of buffered digital signal sets of a first band to detect cyclic characteristics of the digital signals; (b) perform the FFT on the digital signals of the first band to determine energy characteristics of the digital signals; (c) store the IQ data of the first band in the one or more databases; and repeat (a) (c) for each subsequent band.

In another embodiment, the processor is further configured to perform heuristic match based on the energy characteristics and/or the cyclic characteristics of the digital signals that do not match with the stored signal data, and the processor stores the digital signals that do not match with the stored signal data in the one or more databases.

In another aspect, a system for detecting and identifying signals in real-time is provided. The system can include one or more antennas for capturing electromagnetic signals, an analog-to-digital converter (ADC) in communication with the one or more antennas and configured to convert the captured electromagnetic signals into digital signals, one or more databases comprising stored signal data and/or associated parametrics, and a processor in communication with the ADC and the one or more databases. The digital signals can include IQ data. The processor can be configured to dynamically cause the one or more antennas to incrementally sweep through a predefined frequency range to capture electromagnetic signals. The incremental sweep can include a plurality of bands having a predefined step size, and the incremental sweep can include a predefined dwell time for each band of the plurality of bands. The processor can perform a Fast Fourier Transform (FFT) on the digital signals to determine energy characteristics of the digital signals and compare the energy characteristics with the stored signal data stored in the one or more databases. The processor can also buffer, simultaneously with performing the FFT and comparing the energy characteristics, the IQ data of the digital signals in Random Access Memory (RAM) to produce a buffered digital signal set and channelize the buffered digital signal set to produce a plurality of buffered digital signal sets. The IQ data can be buffered for a predefined period of time. The processor can also perform, simultaneously with performing the FFT and comparing the energy characteristics, a cyclostationary algorithm on the plurality of buffered digital signal sets to detect cyclic characteristics of the digital signals and compare the cyclic characteristics with the stored signal data stored in the one or more databases. The processor can identify digital signals based on the comparisons of the energy characteristics and cyclic characteristics with the stored signal data and display the identified digital signals on a graphic user interface. The digital signals can be buffered in the RAM for a predefined period of time.

In one embodiment, after performing the FFT on the digital signals, the processor can be configured to display the energy characteristics on the graphic user interface. Additionally, or alternatively, after performing the cyclostationary algorithm on the plurality of buffered digital signal sets, the processor can be configured to display the cyclic characteristics on the graphic user interface.

In another embodiment, after performing the FFT on the digital signals, the processor can be configured to store the energy samples in the one or more databases. Additionally, or alternatively, after performing the cyclostationary algorithm on the plurality of buffered digital signal sets, the processor is configured to store the cyclic samples in the one or more databases.

In another embodiment, the one or more antennas include a directional antenna configured to capture signals of radio frequencies between 250 MHz and 26 GHz and an omnidirectional antenna configured to capture signals of radio frequencies between 20 MHz and 43.5 GHz. The processor can be configured to execute a coherent subtraction algorithm to locate detected signals. The processor can be configured to subtract the signals captured by the omnidirectional antenna from the signals captured by the directional antenna to produce a subtracted output. The subtracted output can be transmitted into the cyclostationary algorithm or a burst detector.

In another embodiment, the processor can be further configured to perform a geolocation algorithm to identify a location of the identified signals. The geolocation algorithm can include time-difference-of-arrival geolocation, frequency-difference-of-arrival geolocation, angle of arrival geolocation, or any combination thereof.

In another embodiment, the energy characteristics and cyclic characteristics can be combined and simultaneously compared with the stored signal data stored in the one or more databases.

In another aspect, a non-transitory computer readable medium for storing instructions is provided. When the instructions are executed by the one or more processors, the one or more processors dynamically cause one or more antennas to incrementally sweep through a predefined frequency range to capture electromagnetic signals. The incremental sweep comprises a plurality of bands having a predefined step size, and the incremental sweep comprises a predefined dwell time for each band of the plurality of bands. The one or more processors cause a software defined radio (SDR) to convert the captured electromagnetic signals into digital signals, with the digital signals comprising IQ data. The one or more processors can perform a Fast Fourier Transform (FFT) on captured digital signals to determine energy characteristics of the digital signals and compare the energy characteristics with the stored signal data stored in one or more databases. The one or more processors can buffer, simultaneously with performing the FFT and comparing the energy characteristics, the IQ data of the digital signals to produce a buffered digital signal set, wherein the IQ data is buffered for a predefined period of time, and wherein the IQ data is buffered in Random Access Memory. The one or more processors can channelize, simultaneously with performing the FFT and comparing the energy characteristics, the buffered digital signal set to produce a plurality of buffered digital signal sets. The one or more processors can perform, simultaneously with performing the FFT and comparing the energy characteristics, a cyclostationary algorithm on the plurality of buffered digital signal sets to detect cyclic characteristics of the digital signals. The one or more processors can compare, simultaneously with performing the FFT and comparing the energy characteristics, the cyclic characteristics with the stored signal data stored in the one or more databases. The one or more processors can identify the digital signals based on the comparisons of the energy characteristics and cyclic characteristics with the stored signal data. The one or more processors can display the identified digital signals on a graphic user interface.

In one embodiment, the predefined period of time is based on cyclic parameters of the electromagnetic signals within the predefined frequency range. Dynamically causing the one or more antennas to incrementally sweep through the predefined frequency range can include automatically determining a dynamic noise floor of the captured electromagnetic signals having radio frequency (RF) activity during an initial sweep. After the initial sweep, the one or more processors can (a) perform the cyclostationary algorithm on the plurality of buffered digital signal sets of a first band to detect cyclic characteristics of the digital signals; (b) perform the FFT on the digital signals of the first band to determine energy characteristics of the digital signals; (c) store the IQ data of the first band in the one or more databases; and repeat (a) (c) for each subsequent band. The one or more processors can perform heuristic match based on the energy characteristics and/or the cyclic characteristics of the digital signals that do not match with the stored signal data, and wherein the processor stores the digital signals that do not match with the stored signal data in the one or more databases.

BRIEF DESCRIPTION OF THE DRAWINGS

The preceding aspects and many of the attendant advantages of the present technology will become more readily appreciated by reference to the following Detailed Description when taken in conjunction with the accompanying simplified drawings of example embodiments. The drawings briefly described below are presented for ease of explanation and do not limit the scope of the claimed subject matter.

FIG. 10 depicts an interactive map displaying the geolocation of the emitters.

FIG. 12 depicts another interactive map displaying the geolocation of the emitters.

DETAILED DESCRIPTION

Figure 1A:
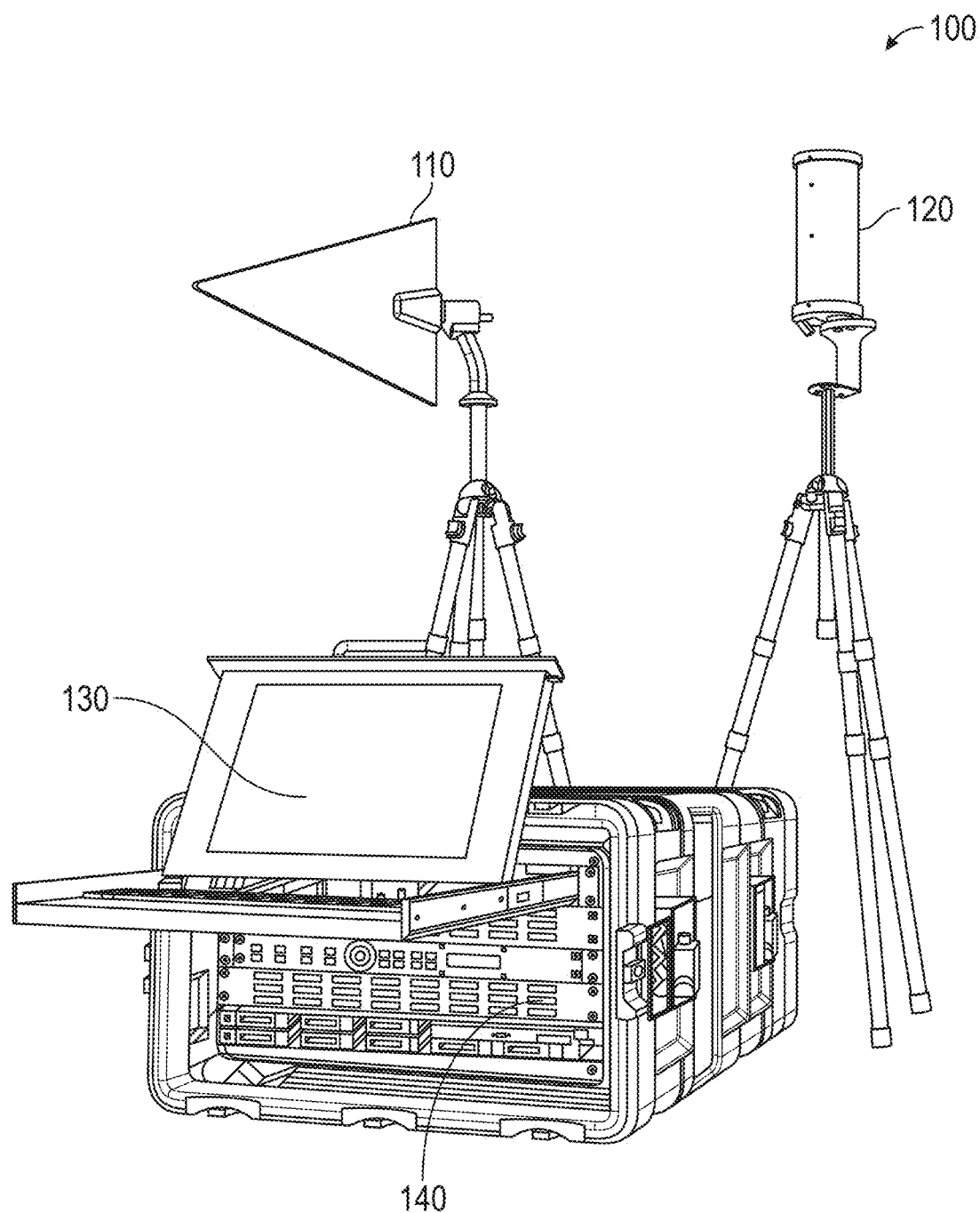
FIG. 1A depicts an embodiment of a system for detecting and classifying signals in real-time.

The present disclosure is directed toward real-time ultra-wideband signal processing techniques that can provide an asymmetric advantage with blind signal detection, classification, and geolocation capabilities. The disclosed apparatuses, systems, and methods can be designed to be fundamentally hardware agnostic, functioning on any compute platform and any radio. The disclosed systems can run autonomously or with a user at a terminal.

The present disclosure enables real-time characterization of potential electromagnetic threats, vulnerabilities, and anomalies, including those operating below the noise floor. The disclosed signal processing techniques have proven performance against Low Probability of Intercept/Detection/Exploitation Signals (LPI/LPD/LPE), including frequency hopped spread spectrum signals, burst communications, pulsed emitters, wideband chirps, and other exotic waveforms.

The present disclosure also provides the ability to exploit signals independently across separate systems and channels. The disclosed systems support direction finding (DF) and full radio frequency (RF) physics-based geolocation using time/frequency-difference-of-arrival (T/FDOA), including signal processing approaches requiring long integration times. The disclosed systems can use disciplined oscillators with low-phase noise to ensure high-fidelity measurements and precise tracking of signals in the electromagnetic spectrum, enabling situational awareness and informed decision-making during field operations.

The disclosed signal processing techniques can also be based solely on first principles that do not require artificial intelligence or machine learning. As such, the disclosed signal processing can be infallible and unable to be spoofed, unlike current radio frequency machine learning techniques. Furthermore, the disclosed signal processing techniques do not require retraining or fine-tuning models for operation.

The present disclosure also includes novel transmission capabilities. For example, the transmission capabilities can include over the air coherent transmit capabilities that enable real-time efficient jamming, communication, and electronic attack techniques. Additionally, the disclosed transmission capabilities can generate unique waveforms carrying bits over a spread spectrum with random sequences, frequency hopped spread, wideband coherent chirps, pulsed signals, and other unique modulation types that can be up to 400 MHz wide.

The disclosed signal processing techniques also enable the detection and identification of the life of a signal pattern. For example, the disclosed systems can be configured for custody tracking and dynamic filtering of signals via on-time and associated time to live. The disclosed systems can also track how long (e.g., dynamically) a specific signal has been on the air to discover new signals and develop a pattern of life for existing signals. Additionally, the disclosed systems can be configured to conduct automated triggered recordings based on identified rates or other signal characteristics.

Example Hardware

With reference to FIG. 1A, an embodiment of a system 100 for detecting and classifying signals in real-time is illustrated. System 100 can include one or more antennas (110, 120) configured to capture samples of radio frequencies. System 100 can further include a radio (not illustrated) configured to detect frequencies between 100 KHz and 43 GHz at a 200 MHz bandwidth. System 100 also includes a server 140 for processing and storage and a graphical user interface 130. In one example, the GUI 130 can be a kernel-based virtual machine, and the server can be a 1U server that is installed in a rack unit. Additionally, an ultrawideband omnidirectional antenna 120 can be configured to capture frequencies between 20 MHz and 40 GHz. Additionally, an ultrawideband directional antenna 110 can be configured to capture frequencies between 250 MHz and 26 GHz. System 100 is configured to sweep through user-specified frequencies and detect events from the sweeping activity. The detected events are recorded in a database, which can be used in the underlying processing logic and settings for dedicated recordings.

Figure 1B:
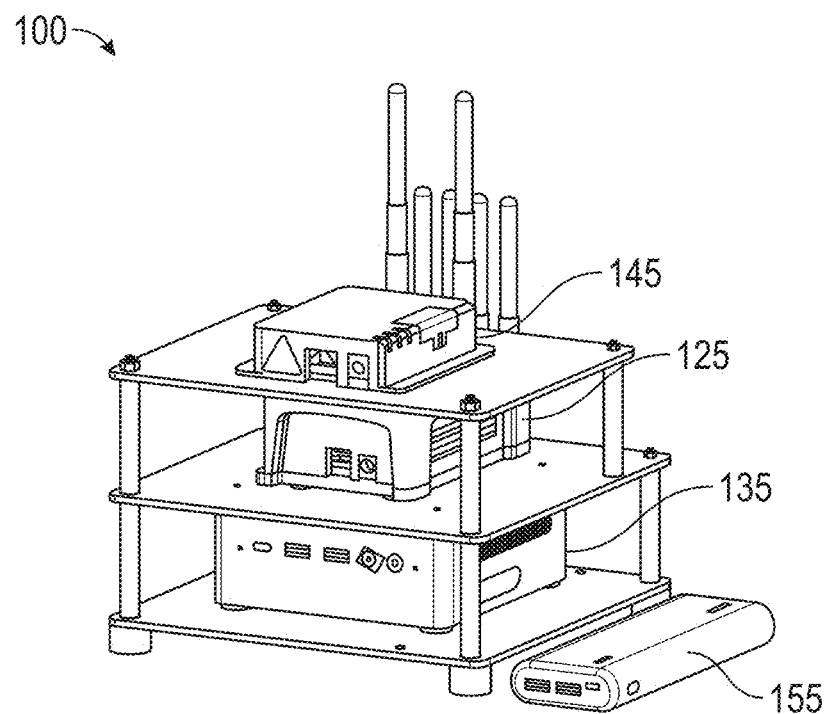
FIG. 1B depicts an alternative embodiment of a system for detecting and classifying signals in real-time
Figure 1C:
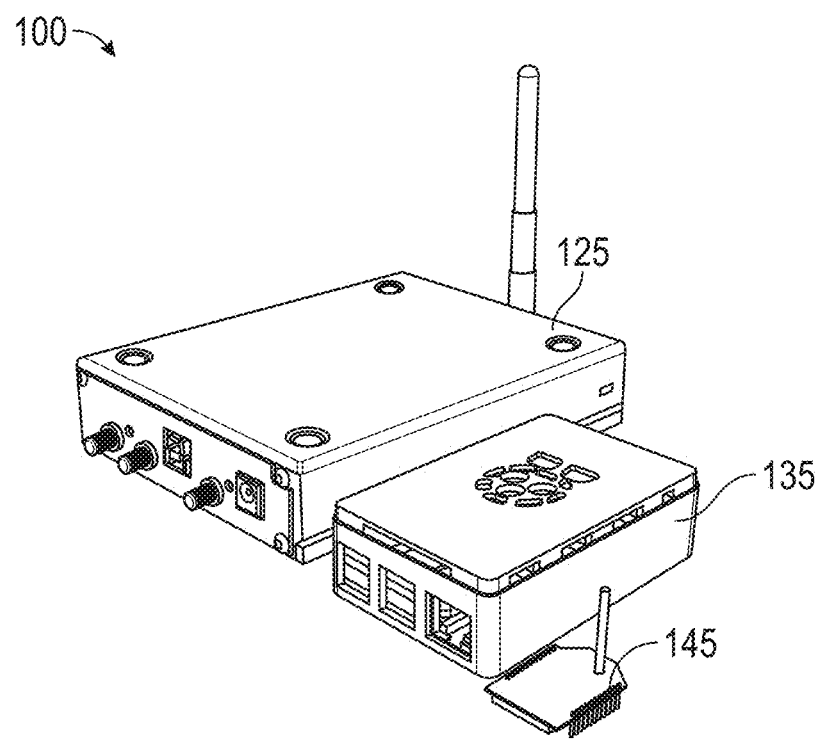
FIG. 1C depicts an alternative embodiment of a system for detecting and classifying signals in real-time

The disclosed signal processing techniques can be performed with resourceconstrained hardware that enables usage in the field. Referring to FIG. 1B, an alternative embodiment of a system 100 for detecting and classifying signals in real-time is illustrated. In addition to one or more antennas (not illustrated), the system 100 can include a software defined radio (SDR) 125, a processor 135, a radio modem 145, and a GPS disciplined oscillator (GPSDO) 155. In one example, the process 135 can be a NUC with a 50 MHz I/Q receiving stream can achieve the disclosed signal processing. In yet another alternative embodiment, a system 100 is illustrated in FIG. 1C. The system can include a software defined radio (SDR) 125, a processor 135, and a radio modem 145. In one example, the processor 135 can be a Raspberry Pi 5 with a 20 MHz I/Q receiving stream that can achieve the disclosed signal processing.

The disclosed systems 100 can also include a disciplined oscillator that uses an external reference signal (e.g., a GPS signal, a radio signal, or another high-precision oscillator) to improve its frequency stability and accuracy. System 100 can deploy signal processing algorithms on a Field-Programmable Gate Array (FPGA) to execute GPS disciplined oscillator (GPSDO) activities, which advantageously reduces the cost of additional equipment to perform the activities.

The systems 100 can be hardware agnostic, making them versatile and costeffective. Advantageously, system 100, rather than the hardware, can be calibrated to enable the use of various components (e.g., sensors, antennas, and filters), allowing for the use of less expensive equipment.

Example Signal Processing Techniques

Figure 2:
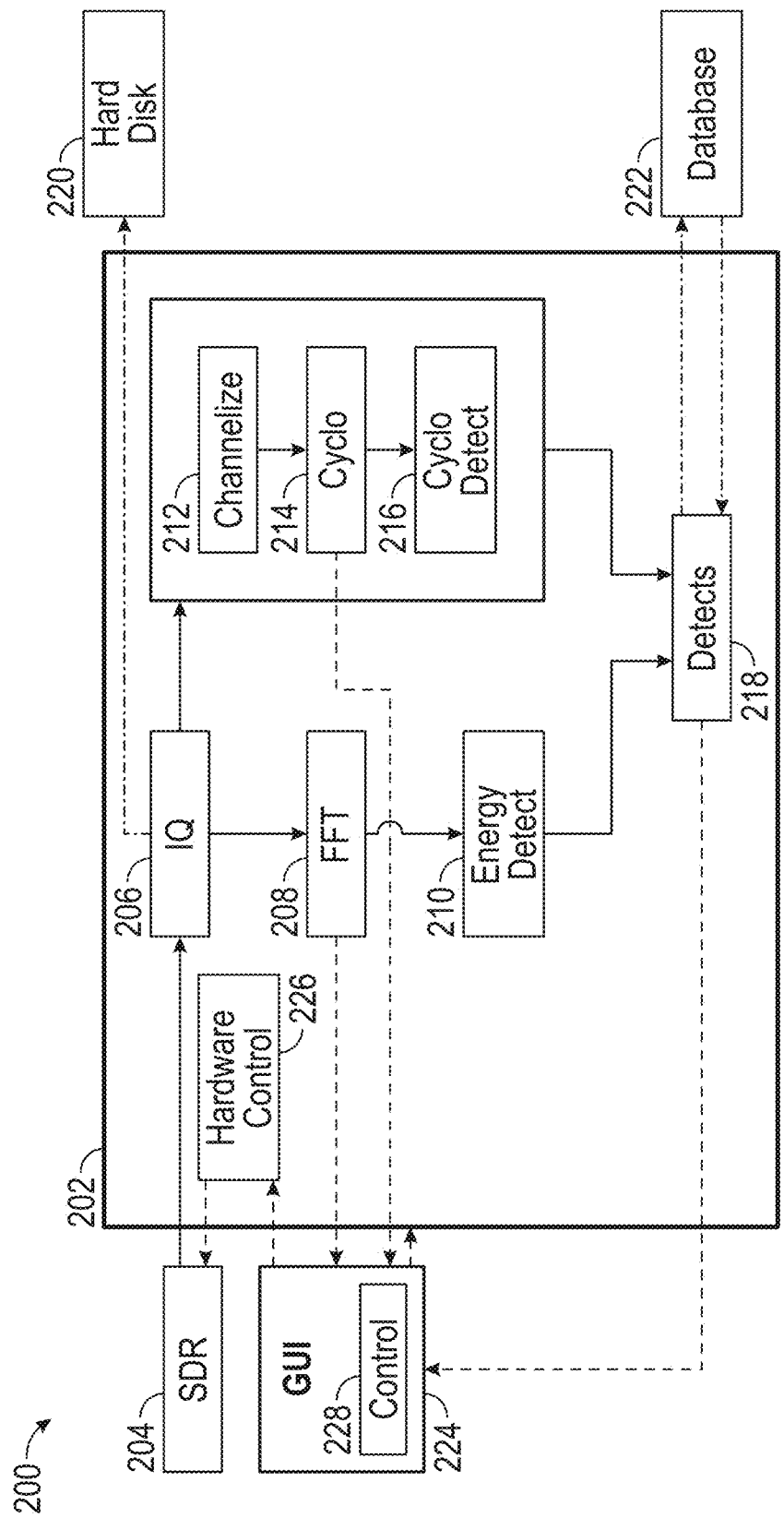
FIG. 2 depicts a block diagram of an embodiment of a system for detecting and classifying signals in real-time.

Turning to FIG. 2, a block diagram of an embodiment of a system 200 for detecting and classifying signals in real-time is illustrated. System 200 includes at least one radio frequency antenna 204, a processor (or server) 202, and a graphical user interface 224. The processor 202 is connected to the at least one antenna 204, graphical user interface (GUI) 224, a hard disk 220, and one or more databases 222. The GUI can be equipped with a controller 228 configured to control the processor 202 and/or the radio frequency antenna 204. The system 200 can operate at bandwidths between about 200 msps and about 500 msps and frequency ranges between about 100 Khz and about 43 Ghz to perform the real-time scanning and detection capabilities. In the illustrative embodiment, the flow of data in the system 200 can be different for different components. For example, the flow of data denoted by solid lines represents data in memory (not illustrated). Similarly, the flow of data denoted by broken lines (e.g., - - - ) represents data flow for GUI controls. Additionally, the flow of data denoted by broken dash-dot lines (e.g., -•-) represents data written to a hard disk).

The disclosed signal processing advantageously enables blind signal classification. For example, with blind signal detection, no a priori knowledge is required to identify signals, unlike conventional techniques. Additionally, the disclosed signal processing techniques allow for characterizing signals operating outside their typical bands, such as WiFi or Bluetooth operating outside of licensed Industrial, Scientific, and Medical (ISM) bands as anomalous activity.

Energy of the captured signals can initially be measured by radio frequency antennas 204 connected to software defined radios (SDRs). The SDRs can conduct a step and dwell operation in which the frequencies of interest are subdivided into smaller bands which are then observed for a set duration of time, allowing the system 200 to observe a wide bandwidth of spectrum without requiring large datasets to be processed or overwhelming the computational processors available.

The analog to digital converting capabilities within the SDRs can convert the raw electromagnetic energy into in-phase/quadrature (I/Q) data 206, which provides information for signal processing activities. The I/Q data 206 can then be provided with metadata. For example, the metadata can include a precision time tag by the SDR for conducting signal processing activities. The precision time can be determined at the nanosecond scale. The I/Q data 206 can then be transmitted for energy detector signal processing and cyclostationary detector signal processing. The metadata representation can be used to classify signals, which can advantageously enable multi-sensor geolocation activities to be conducted with low bandwidth for congested or contested electromagnetic environments.

The processor 202 conducts a Fast Fourier Transform (FFT) 208 on the I/Q data 206 that can be utilized to convert the time domain representation of signal information to the frequency domain. The rapid decomposition of the complex signal into its frequency spectra provided by the FFT 208 allows for precise signal analysis and manipulation of signal characteristics required for various signal processing techniques required to conduct signal identification and classification. This conversion can be utilized to detect the spectral content of various frequencies in the energy detector 210. The output of the energy detector 210 can then be provided as detection events and logged in the detection database 222 with relevant information used to describe the observed event's spectral characteristics. The output of the FFT process 208 can be displayed as a power spectral density, which can provide a graphical representation of how a signal's energy (or power) is distributed across different frequency components by displaying the amplitude, or magnitude, and phase of each frequency component present in the sampled signal. The PSD output can be a water-fall plot.

The PSD data can help identify the detection of energy within frequency bands that indicate that a signal is present within the band being observed. Additionally, the individual events can be compared against specific signal parameters identified in the signals database 222 to define features of the observed signal against known signals to provide additional context to users via the detection database 222. The database 222 can be updated and saved on the hard disk 220. The processor 202 can analyze segments of the PSD and collect the maximum of each segment. Based on the collection, the processor 202 can set the noise floor estimation as the minimum of the collection. Furthermore, the disclose signal processing advantageously enables identifying signals below the noise floor. For example, the disclosed signal processing can identify and characterize signals typically seen as Low Probability of Detect or Low Probability of Intercept (LPI/LPD).

The processor 202 can also set the moving average of the PSD by summing blocks (or portions) of the PSD to remove unwanted noise (or interference) from the signal that is being visualized on the GUI 224. The moving average can be used to compute the noise floor dynamically, which helps distinguish between actual signals and background noise. By calculating the noise floor, the system can denoise the PSD data before performing burst detection, which helps ensure that significant energy bursts (e.g., indicative of potential signals) are detected. The moving average also allows the system to adapt to changing environmental conditions and hardware variations. For example, as the hardware heats up (or the environment changes), the noise floor can shift. Thus, the moving average helps in maintaining accurate signal detection by continuously updating the noise floor. The moving average reduces the number of false positives by, for example, comparing energy level against a dynamically calculated noise floor, with energy level significantly above the noise floor being considered potential signals. The moving average also enhances the detection of low-powered signals that might be missed if, for example, a static noise floor were used. Thus, the system advantageously is capable of identifying LPI and LPD signals. The adaptive nature of the moving average also optimizes the performance of the system across different environments and hardware conditions, producing a reliable system for long-term spectrum monitoring and real-time analysis. The moving average functionality can also increase the efficiency of the data processing by focusing on significant energy bursts and filtering out the background noise, allowing the system to handle high data rates and perform real-time analysis.

Figure 4:
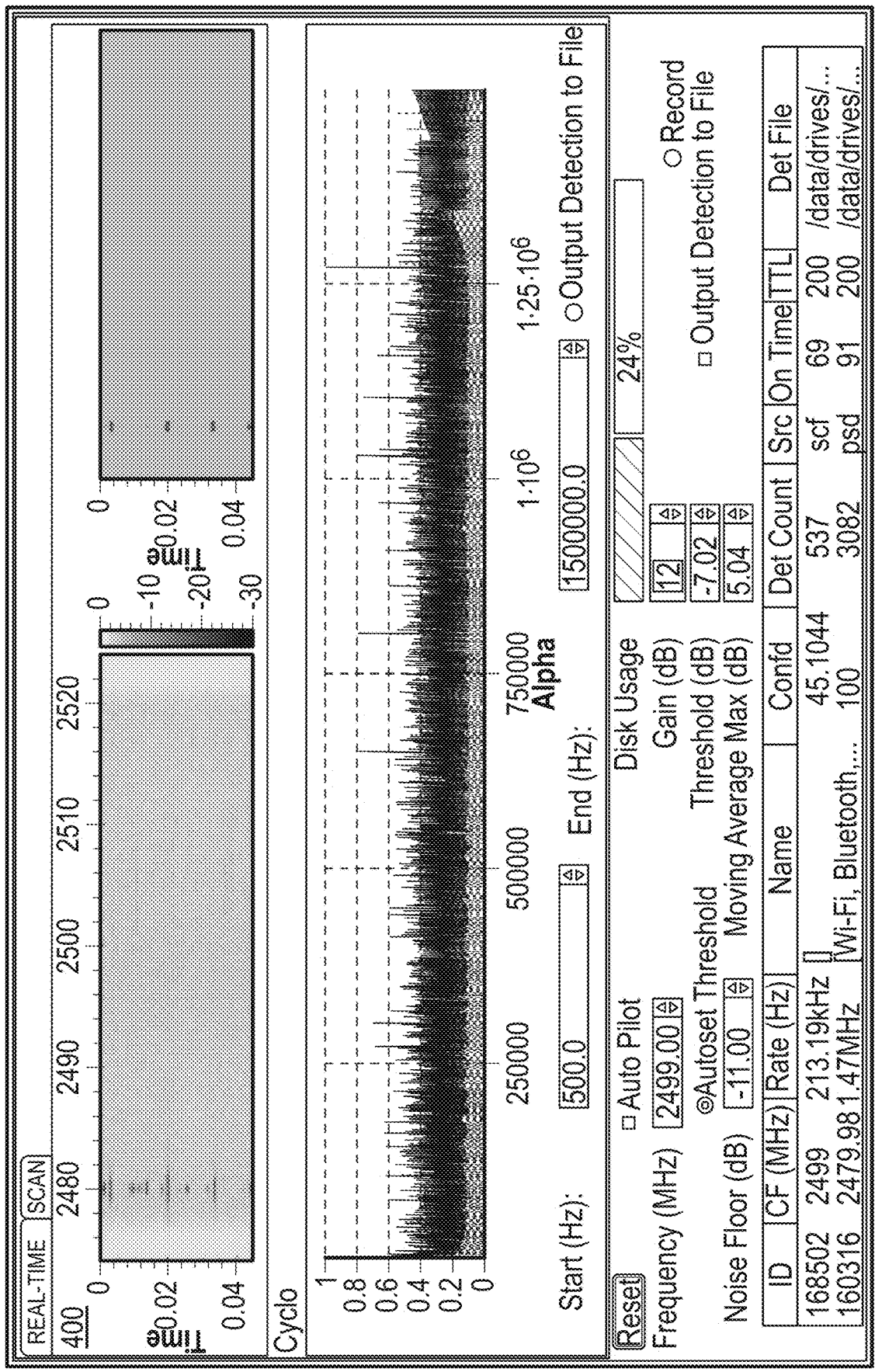
FIG. 4 depicts an embodiment of an energy detection graphic user interface.

Referring to FIG. 4, an example of an energy detection GUI 400 is depicted. In the illustrative embodiment, the energy detection GUI 400 has identified signals at 2481 Mhz based on the dataset of signals stored in the signal database. As described below, the FFT processing 208 can be utilized for power spectral density and cyclostationary analysis. Additionally, the FFT processing 208 can be used within the spectral correlation function (SCF) for cyclostationary processing.

Turning back to FIG. 2, simultaneously with the FFT 208 and energy detector 210 processing, the I/Q data 206 can be aggregated via a buffer system until a predefined time length of data is recorded. For example, the predefined time length can be set by the user requested cyclostationary signal processing parameters 214. It is preferable to buffer the I/Q data 206 for cyclostationary signal processing parameters 214 because the lower cyclic rates utilized in the cyclic auto-correlation function have optimal performance with additional samples for low-rate detection. For example, larger datasets of I/Q data 206 are preferable to conduct cyclostationary signal processing because some cyclic features occur over a longer time interval. The high sample rates advantageously enable accurate signal direction finding. It is also advantageous to prioritize sending the I/Q data 206 to the buffer over immediate processing because it ensures that no samples are dropped in the process, producing coherent processing. It can also be advantageous to buffer the I/Q data 206 in Random Access Memory (RAM) because it provides a mechanism to write and read data more rapidly than on a hard drive.

After sufficient I/Q data 206 has been acquired in the buffer (e.g., as determined by the predefined time length), the processor 202 begins to pull information from the buffered data and conduct signal processing activities. For example, the information (e.g., wideband data) is then channelized 212 to break the large dataset into more manageable (or smaller) sets of data to process in a parallelized fashion. The processor 202 can be configured to conduct multi-threading and parallelize the computational activities (e.g., channelizing) via a multi-core CPU. As a result, the time to obtain results advantageously decreases as multiple threads from a multi-core CPU can be operating in parallel instead of a single core operating sequentially when using the entire dataset.

The channelizing (or segmentation) process 212 can be leveraged for the cyclostationary activities (or processing) when conducting the Spectral Correlation Function (SCF) as it will provide higher resolution results with lower noise when compared to the results if conducted on the entire dataset. Additionally, channelizing 212 can be performed before conducting cyclostationary signal processing as a large amount of data, or a large duration of recording, can be required to yield high-fidelity results. For example, when conducting the SCF it can be necessary to conduct an iterative analysis on a given IQ dataset 206, and channelizing 212 allows for the computational activities on this dataset to be divided into more manageable sizes that allow for multiple CPU cores to independently conduct operations in parallel yielding faster results and providing real-time analysis of the spectral environment. Both the number of channels and FFT size can define the recording duration.

The output of the channelizer 212 can then be fed into the cyclostationary signal processing 214 to conduct cyclic auto-correlation function and SCF processing activities that yield information into specific cyclic rates identified in the dataset being processed (e.g., cyclostationary detection 216). The cyclostationary signal processing 214 utilizes techniques designed to exploit the inherent periodicity in the statistical properties of communication signals. Unlike stationary signals, which exhibit constant statistical measures over time, cyclostationary signals display periodic variations in parameters such as mean, variance, or autocorrelation, forming predictable cyclic patterns. These periodic variations (i.e. cyclostationary properties), are commonly observed in signals employed in digital modulation schemes, analog communication systems, and radar. By leveraging these properties, the cyclostationary processing 214 facilitates blind signal detection by identifying cyclic rates within datasets. When combined with additional data such as center frequency and bandwidth, these cyclic features enable the characterization of unknown signals without prior knowledge of their structure.

The SCF is a fundamental algorithm utilized in cyclostationary signal processing and can identify periodic variations that are apparent in the statistical analysis of signals being observed. The SCF can quantify the correlation between different frequency components of a signal at specific cyclic frequencies. In other words, the SCF can identify repeating patterns or cycles in signals that are not stationary and produce some indication of the various signal processing techniques utilized to embed data into signals. The SCF can be analyzed to detect 216 local peaks and patterns that correspond to cyclostationary features of the signal and provide an indication of the signal's characteristics, such as modulation, symbol rates, and other periodic processing traits. For example, the cyclostationary process (or algorithm) 214 can be used to identify repeating patterns or cycles in signals that are not stationary and produce some indication of the various signal processing techniques utilized to embed data into signals. In one example, the cyclostationary process 214 can utilize the SCF, which quantifies the correlation between different frequency components of a signal at specific cyclic frequencies. The SCF parameters can define the duration, or data window length, in which a set of samples must be recorded for a given bandwidth and sample rate to provide a sufficient dataset to analyze for high-resolution results.

Figure 5:
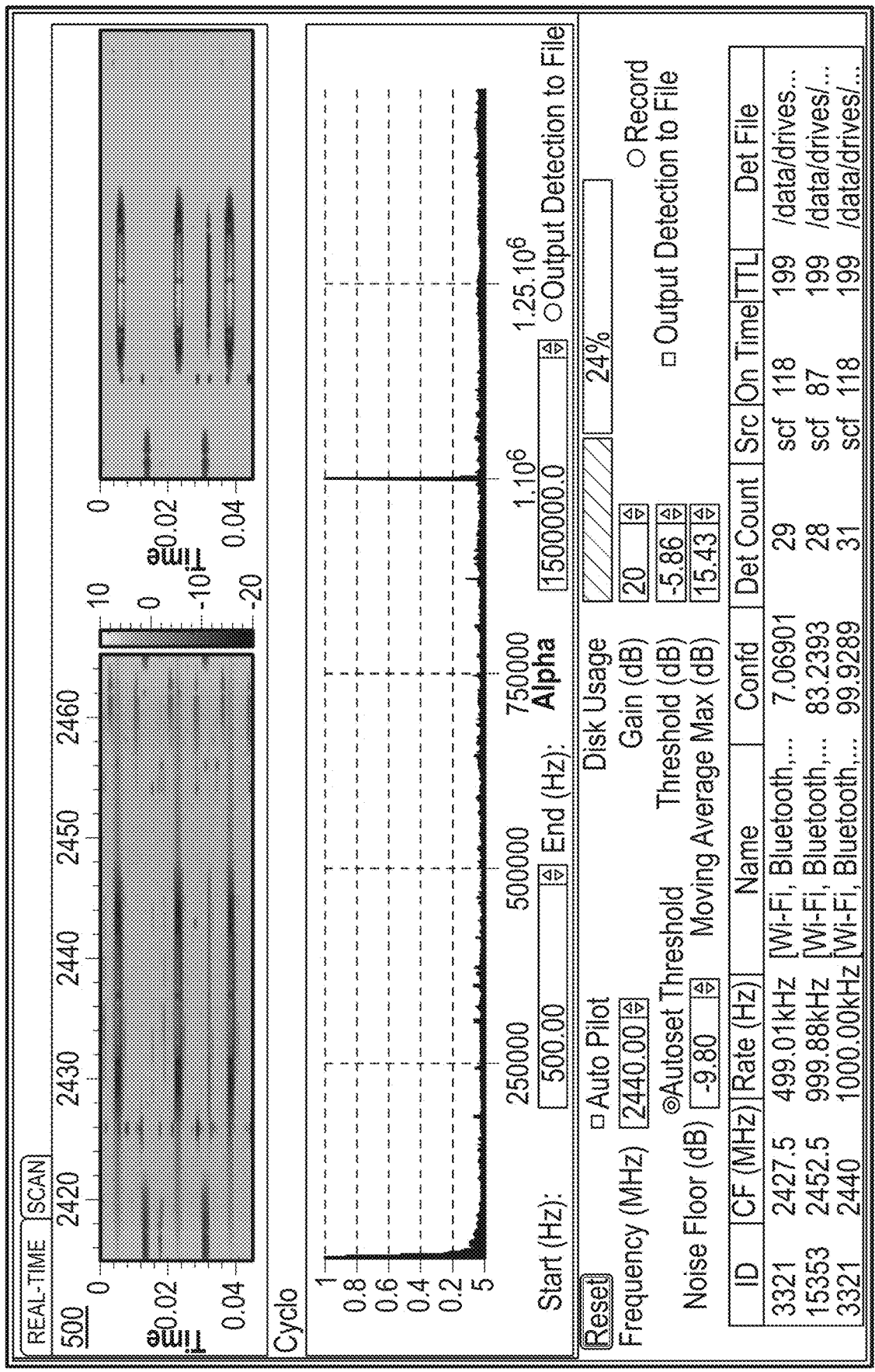
FIG. 5 depicts an embodiment of a cyclostationary detection graphic user interface.

The cyclic auto-correlation function can observe the correlation of a signal with a time-shifted version of itself. The output of the cyclic auto-correlation function can then be processed through a second FFT to transform the data into the frequency domain whose results will reveal a correlation between different frequency components at various cyclic frequencies. These cyclic rates, along with their center frequencies and capture time, are then logged into a database 222 for end users to observe. Signal characteristics, such as rates and center frequencies, can then be compared to known signal parameters defined in the signal database 222 to further define the observed signal for end users. These defining features of the observed signals can then be stored in a detection database 222 and displayed to the users on the GUI 224. The user can control the system 200 through the GUI 224, allowing the user to define the minimum and maximum frequency bands as well as blacklist set bands from being observed. With reference to FIG. 5, an example of a cyclostationary GUI 500 is depicted. In the illustrative embodiment, the cyclostationary detection has identified signals at a 1.0e6 rate (PRI) based on the dataset of signals stored in the signal database.

Figure 6:
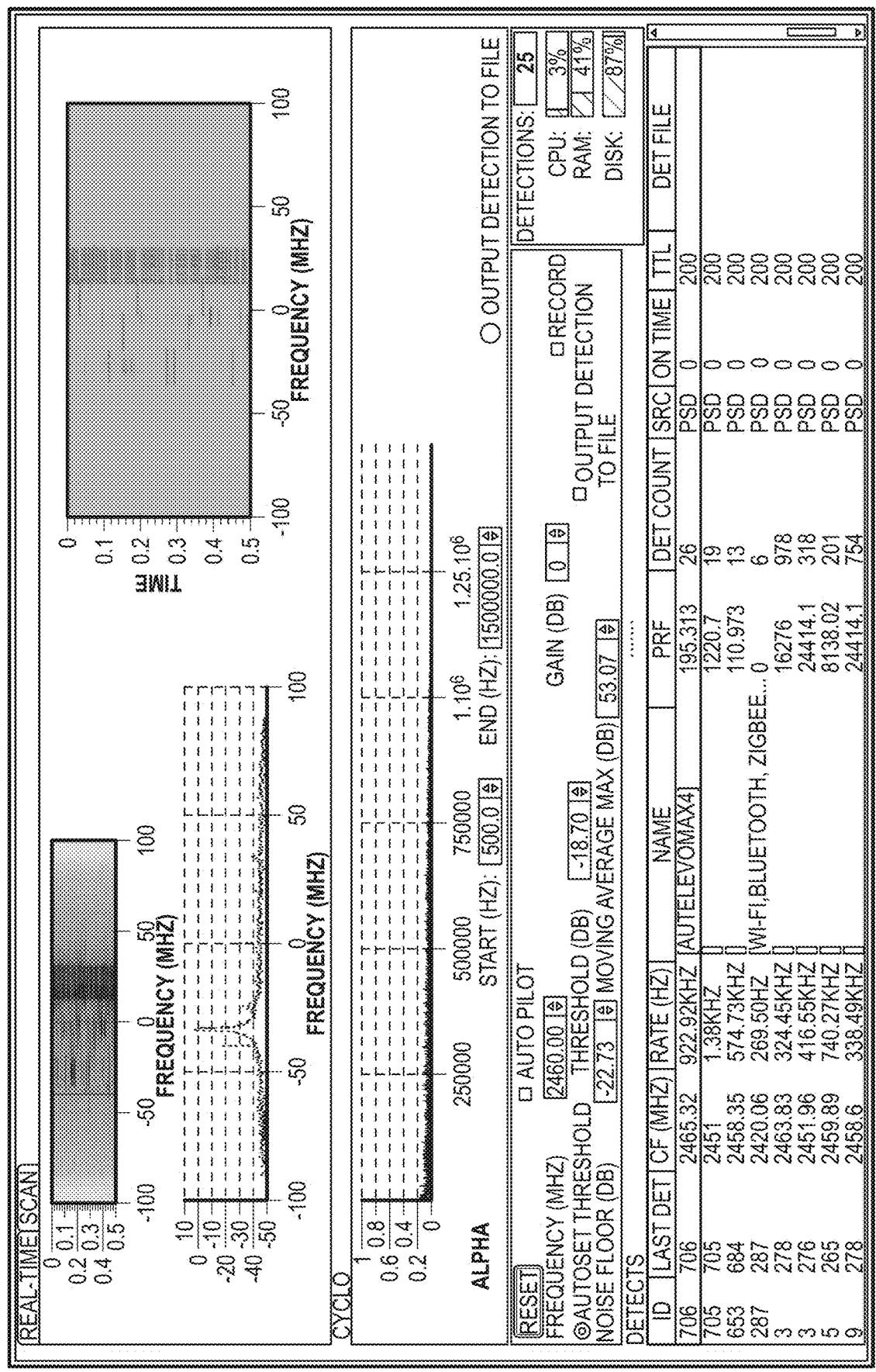
FIG. 6 depicts an embodiment of a graphic user interface detecting a signal.
Figure 7:
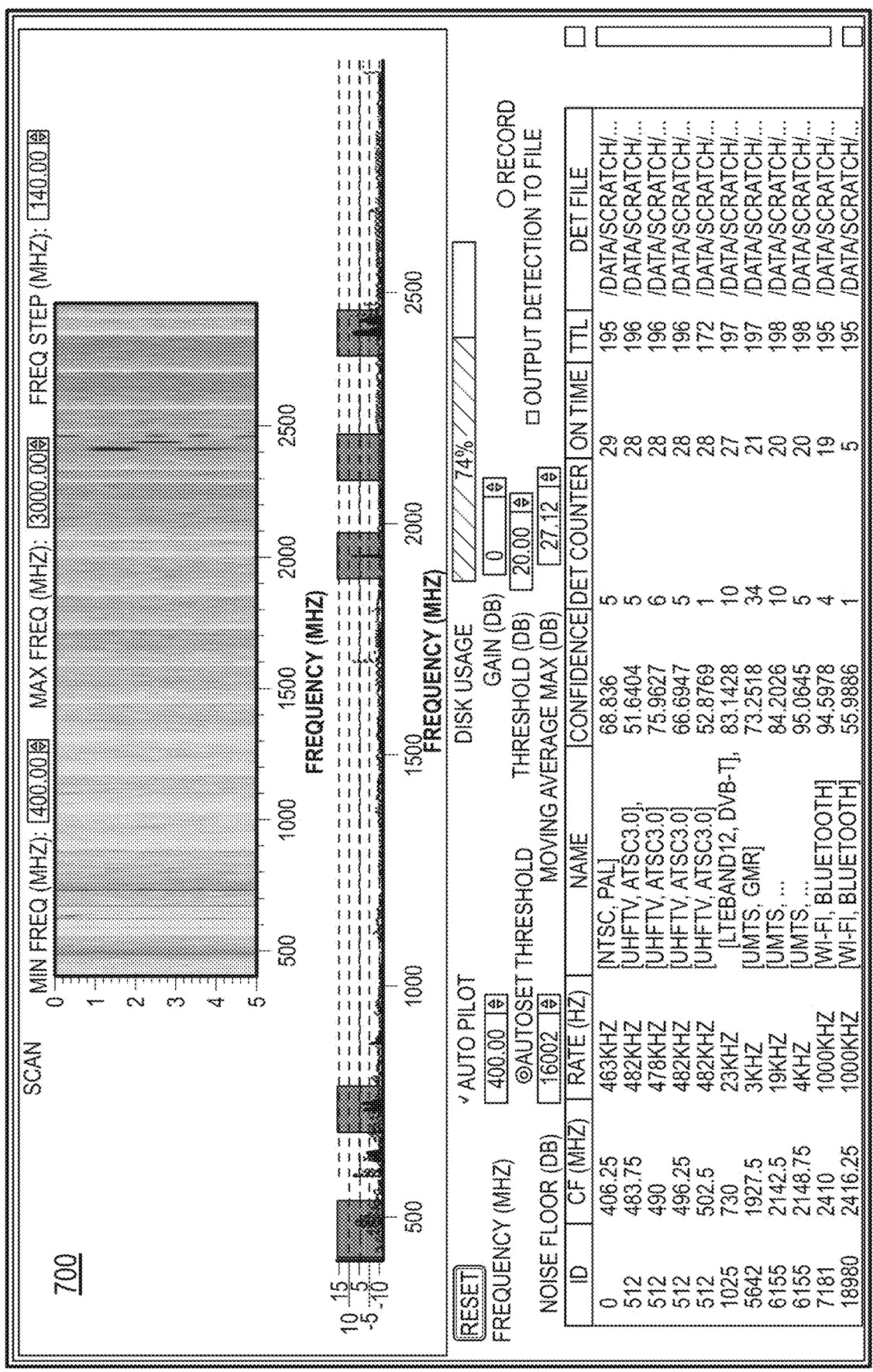
FIG. 7 depicts an embodiment of a graphic user interface displaying signal detection indicators.

The system 200 can be configured to display a real-time stitching of swept I/Q samples into a wideband spectrogram and PSD with change detection and/or new signal indication (e.g., color highlighting) and sweep indication for currently scanned RF and bandwidth of interest (see, e.g., GUI 700 in FIG. 7). Additionally, real-time cyclostationary rates via SCF can be displayed in the GUI 224 along with burst detections using filtered and denoised spectrogram. Additionally, the system 200 can be configured to generate a real-time dashboard with signal pattern life (e.g., time vs. frequency) that are marked with indicia. For example, the dashboard can include time vs. frequency tiles that are colored by cyclostationary rates and/or symbol rates (or emitter type) over a collection period, and a map of collector locations. FIGS. 4-7 depict various illustrations of the real-time stitching of the samples.

Figure 3:
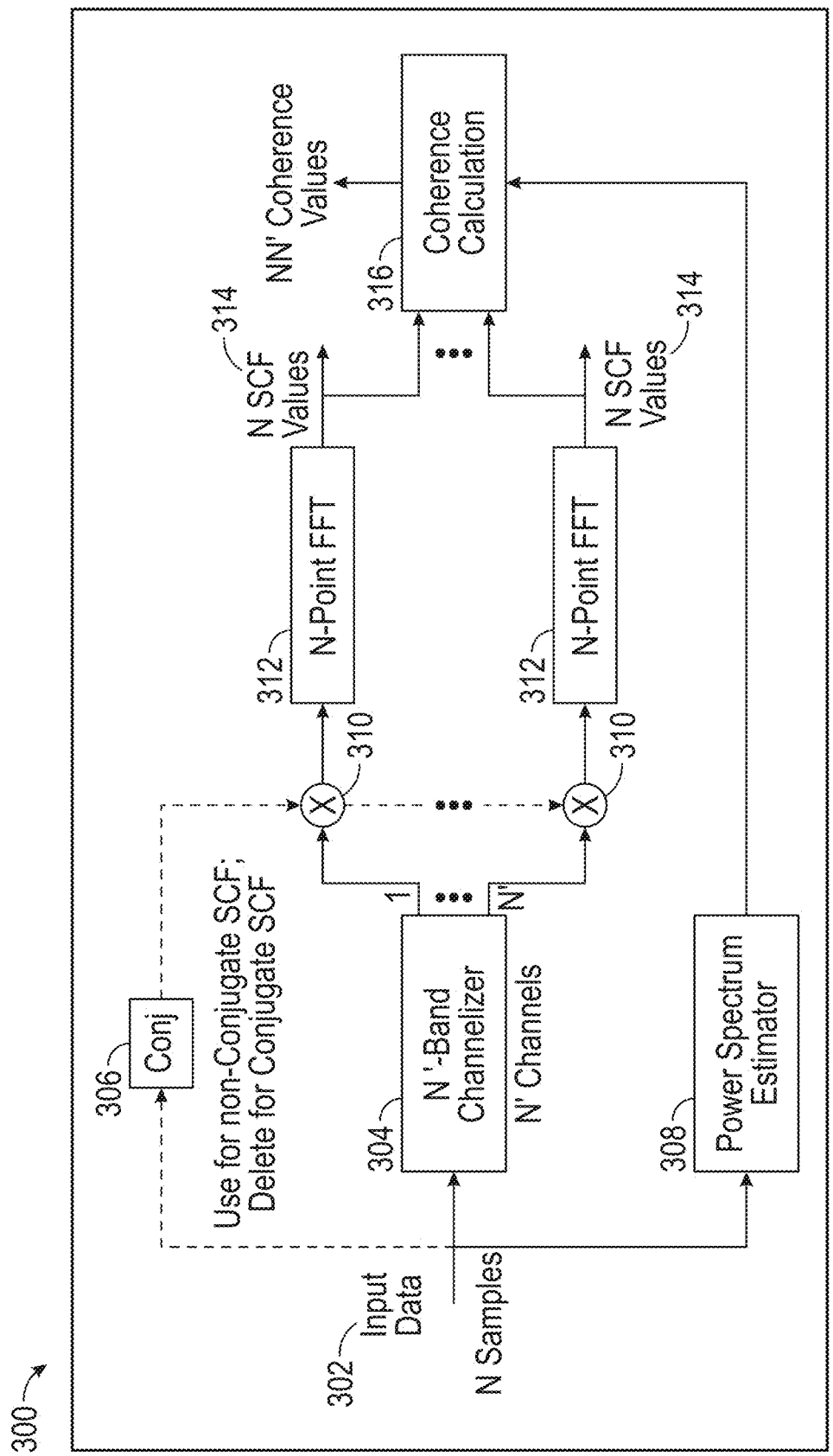
FIG. 3 depicts a block diagram of an embodiment of a strip spectral correlation analyzer processing technique.

Turning back to FIGS. 2 and 3, the cyclostationary process 214 can be based on a modification of the strip spectral correlation analyzer (SSCA) processing technique. With reference to FIG. 3, a diagram of the SSCA processing technique 300 is depicted. Input data 302 can be a time series of "N" samples that are fed to an N'-Band Channelizer 304, where the input signal is divided into N' narrowband frequency channels. The channelization of the input signal can be performed by a filter bank or an FFT. Each channel can then be multiplied 310 by a time-shifted version of the original signal, to produce different cycle frequencies. The multiplication 310 can be performed a second time, with the second multiplication 310 including a conjugate operation 306. The second multiplication 310 only occurs when the desired SCF is a conjugate. The multiplied signals from each channel are then subjected to an N-point FFT 312, which transforms the time-domain signals into the frequency domain, allowing for spectral analysis. The outputs from the two FFTs 314 are used to calculate the coherence 316, which helps identify the presence of cyclostationary components (or characteristics) in the signal. The spectrum estimator 308 can calculate the PSD of the input signal to provide information about the distribution of power across different frequencies.

The disclosed cyclostationary process 214 can modify the SSCA processing technique by utilizing an N'-Band Channelizer 304 to produce a decimated output. Additionally, for low frequencies, the SSCA processing technique can be modified by having the channels be self-conjugate multiplied, allowing input data 302 that is conjugated to be discarded, which is advantageous for low cyclostationary frequencies (e.g., radar or direct-sequence spread spectrum (DSSS) signals). The modified SSCA process also advantageously allows the decimated memory buffers to operate with the same quality as conventional SSCA processes. Furthermore, multiple different channels can be used together to produce the full SCF graph. It can be advantageous for the processor 202 to perform separate detections of PSD and SCF, which allows for identifying powerful signals with no rates (or low-powered signals) that are difficult to see on a PSD waterfall. The PSD can be utilized in conjunction with the SCF to indicate the presence of a signal during operation of the system. The signal detections from the PSD can be logged into the database 222 for review by an end user. Referring to FIG. 6, an example of a detection GUI 600 is depicted. In the illustrative embodiment, the system has detected an unmanned aerial vehicle (UAV) identified as Autel EVO Max 4. The UAV was identified because the system detected about a 1 Mhz-wide burst hopping at about a pulse repetition frequency (PRF) of 200.

By way of example, and not as a limitation, the disclosed systems can be configured with the following configurations listed below in Table 1. The systems disclosed in Table 1 can be equipped with an omnidirectional ultrawideband antenna spanning about 20 MHz to about 40 GHz, a directional wideband antenna spanning about 250 MHz to about 26 GHz, and a portable battery. The systems can be configured with run times between about 30 minutes to over 4 hours using 1, 2, 3, or 4U server configurations

TABLE 1

| System No. | RF Range | No. of Channels | Channel Rate | Total Rate | Bandwidth |
| --- | --- | --- | --- | --- | --- |
| 1 | 100 KHz-40.8 GHz | 1 | 200 MSps | 200 MSps | 160 MHz |
| 2 | 1 MHz-8 GHz | 1 | 500 MSps | 500 MSps | 400 MHz |
| 3 | 10 MHz-6 GHz | 2 | 200 MSps | 400 MSps | 320 MHz |

In the above example, System No. 1 is equipped with a 3U configuration and is capable of real-time detection of signals in the electromagnetic spectrum. System No. 2 is equipped with a 2U configuration and is capable of real-time detection, directional finding, and signal transmission (e.g., for jamming). System No. 3 is equipped with a 2U configuration and is capable of real-time detection, directional finding, and signal transmission.

A geolocation engine can also be utilized to accurately determine the emitter location with heterogeneous observables received from any sensor, avoid vendor lock, and allow upgrades. Geolocation and direction finding techniques can be applied to all signals of interest (e.g., as defined by the user) to identify the source of the signals. For example, geolocation and direction finding can be applied to any signal event that is flagged by the system or any signal event that is detected by the system. In some embodiments geolocation and/or direction finding utilizes at least three of the disclosed systems to locate signals of interest via triangulation. The direction finding (DF) techniques for the signals can be obtained with monopulse radar, two-channel triangulation, or a combination thereof. The geolocation of the signals can be obtained with time-difference-of-arrival (TDOA), frequency-difference-of-arrival (FDOA), angle of arrival (AoA), power distribution ratio measurements, or any combination thereof to triangulate the location of the source. Additionally, techniques including maximum likelihood, least squares, and Bayesian filtering to mitigate errors from noise, timing, power measurements, multipath, and NLOS conditions can be used. In one embodiment, systems utilizing a geolocation engine can have 4 channels, with a channel rate of between about 200 MSps and about 500 MSps, and a bandwidth of between about 160 MHz and about 400 MHz.

Figure 10:
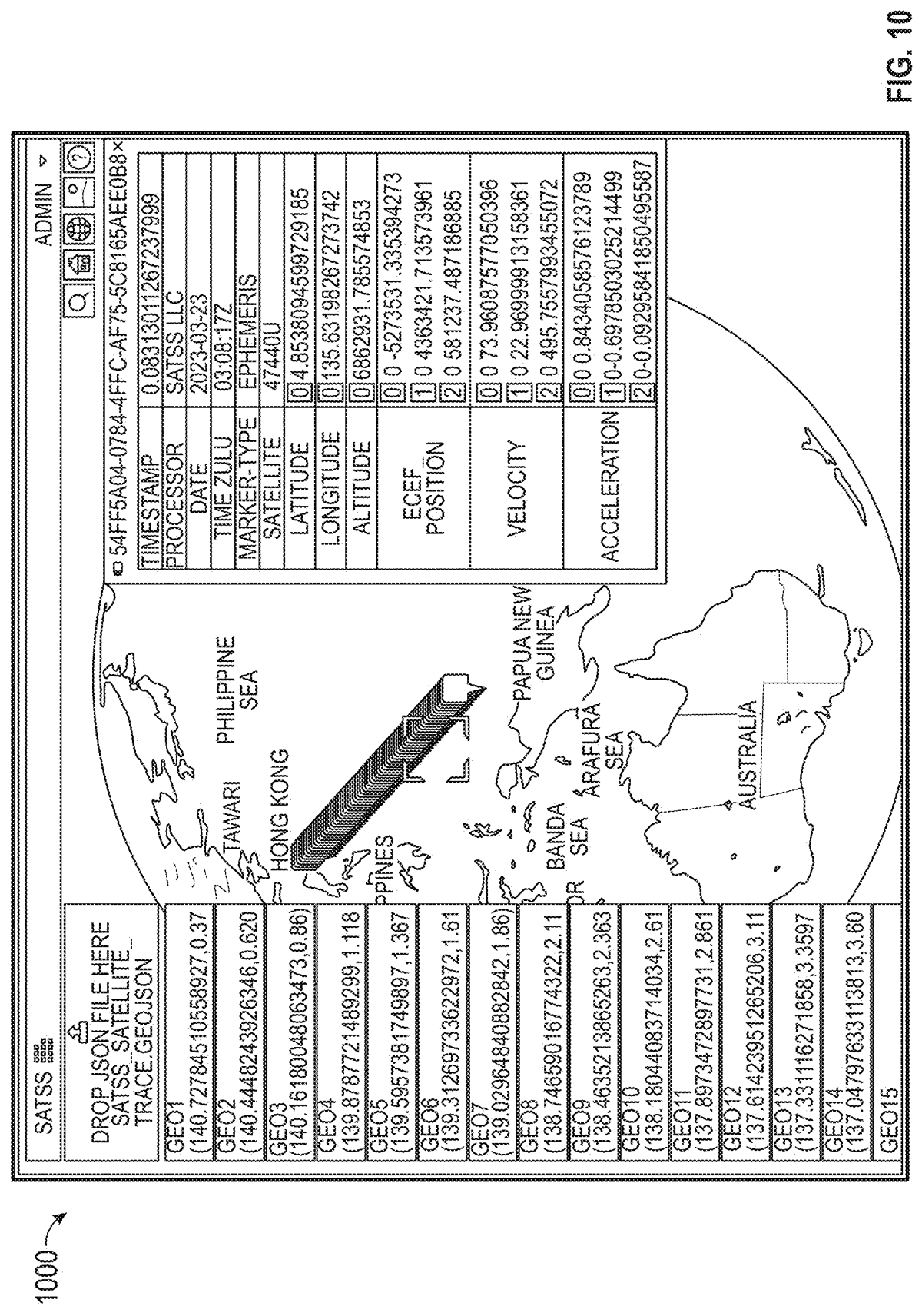
Figure 11:
FIG. 11 depicts another interactive map displaying the geolocation of the emitters.
Figure 12:
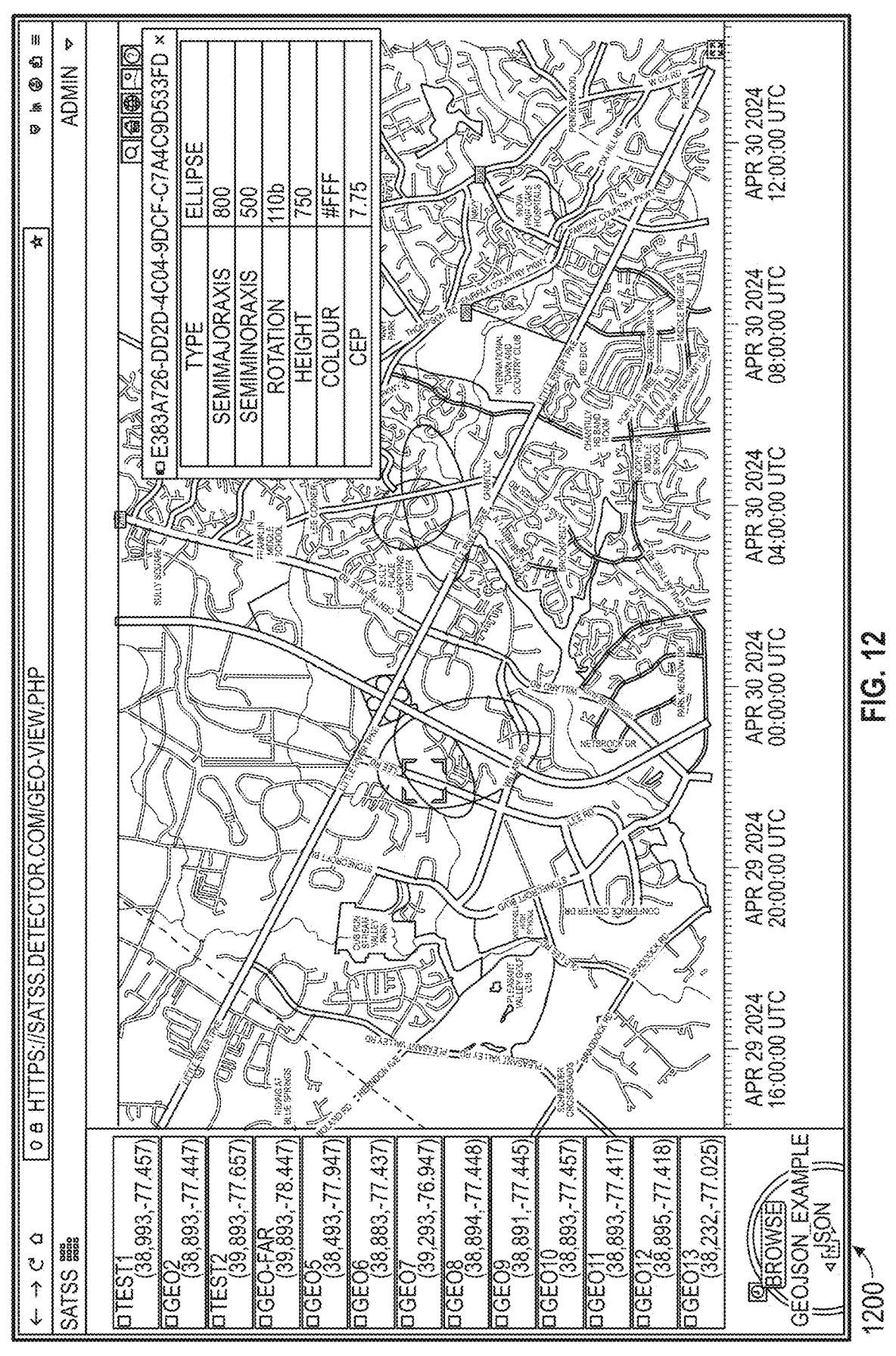

The geolocation engine can utilize signal data input from a variety of collection sources to compute the RF geolocation of the emitters and display the location on an interactive map. The systems can maintain custody of the emitter location through display via the geolocation engine signals database. The systems can also provide a graphical display of historic activity. The system can be configured to execute the activities autonomously, with no human intervention required. The systems can also observe and develop a baseline of the radio frequency environment and continuously monitor for changes in tracked emitter activity and environment. The systems can identify anomalous activity in the spectrum based on the observations and tracking. FIGS. 10-12 depict various examples of interactive maps (1000, 1100, 1200) displaying the geolocation of the emitters.

Additionally, an emitter engine can be utilized for blind detection of radars, drones, and other agile emitters. This signal processing technique can provide signal association and hop counts (e.g., hops per second, baud rate, rf, bandwidth) across multiple RFs for frequency hoppers, and over time and real-time association with the emitter engine. Identification of RFs, Times, Bandwidths, PRIs, PRFs, Baud Rates/Symbols Rates, Hop Rates, On Time, TTL, and Signal Classification can be presented as a table. Geolocation of emitters can be performed using SDRs via time-of-flight (TOF) signal processing, a robust estimation processor for rejecting multi-path and bad measurements, a single platform geolocation, ellipse combining methodology, or any combination thereof.

The system 200 can be configured for the discovery of new signals. For example, an initial sweep of the electromagnetic spectrum capturing I/Q data of the signals can be followed by a subsequent dwell and recording only on the detected signals of interest or new signals then a return to sweep mode for new discovery. This process can be repeated iteratively as needed or desired.

The system 200 can also be configured for a high priority signal mode, RF notch mode, and/or ignore list mode. For example, the system can be adapted to the limit search range in terms of RF sweep by notching and/or removing frequency bands that are not of interest to increase sweep revisit rate, generate a high priority signal mode where specific signals of interest and their parameters (or characteristics) inform the detection criteria, and generate an ignore list of signal parameters to disregard. Identifying indicia (e.g., color highlighting in the results table) can be used for signals of interest, ignored signals, as well as newly discovered signals with optional on times meeting user criteria or colored based on emitter type or signal classification label.

The system 200 can also be configured for modulation recognition. For example, the characterization of a signal's modulation type after subsequent detection can by obtained by using Kurtosis to measure the peakedness of the squared spectrum. Additionally, leveraging higher order spectral moments of the x times squared spectrum for RF signals of interest can be used for characterization. These techniques can provide the ability to determine the modulation type as the shape of the peak of the squared spectrum represents the signals underlying modulation. For a binary phase-shift keying (BPSK) signal, a squared spectrum would provide the sharpest and/or narrowest peak using Kurtosis and other statistical measures.

The system 200 can also be configured for center frequency determination. For example, precision determination of the carrier frequency through squaring a signal once the modulation is determined. The dominant peak offset in the Power Spectral density reveals the center frequency.

The system 200 can also be configured for location-aware recordings. For example, Precision Navigation and Timing (PNT) sources (e.g., GPS or LORAN) can be leveraged to accomplish this functionality. The system can be adapted to provide context (e.g., via characteristics determined through signal processing) to all signals blindly identified using our proposed approaches.

Figure 8:
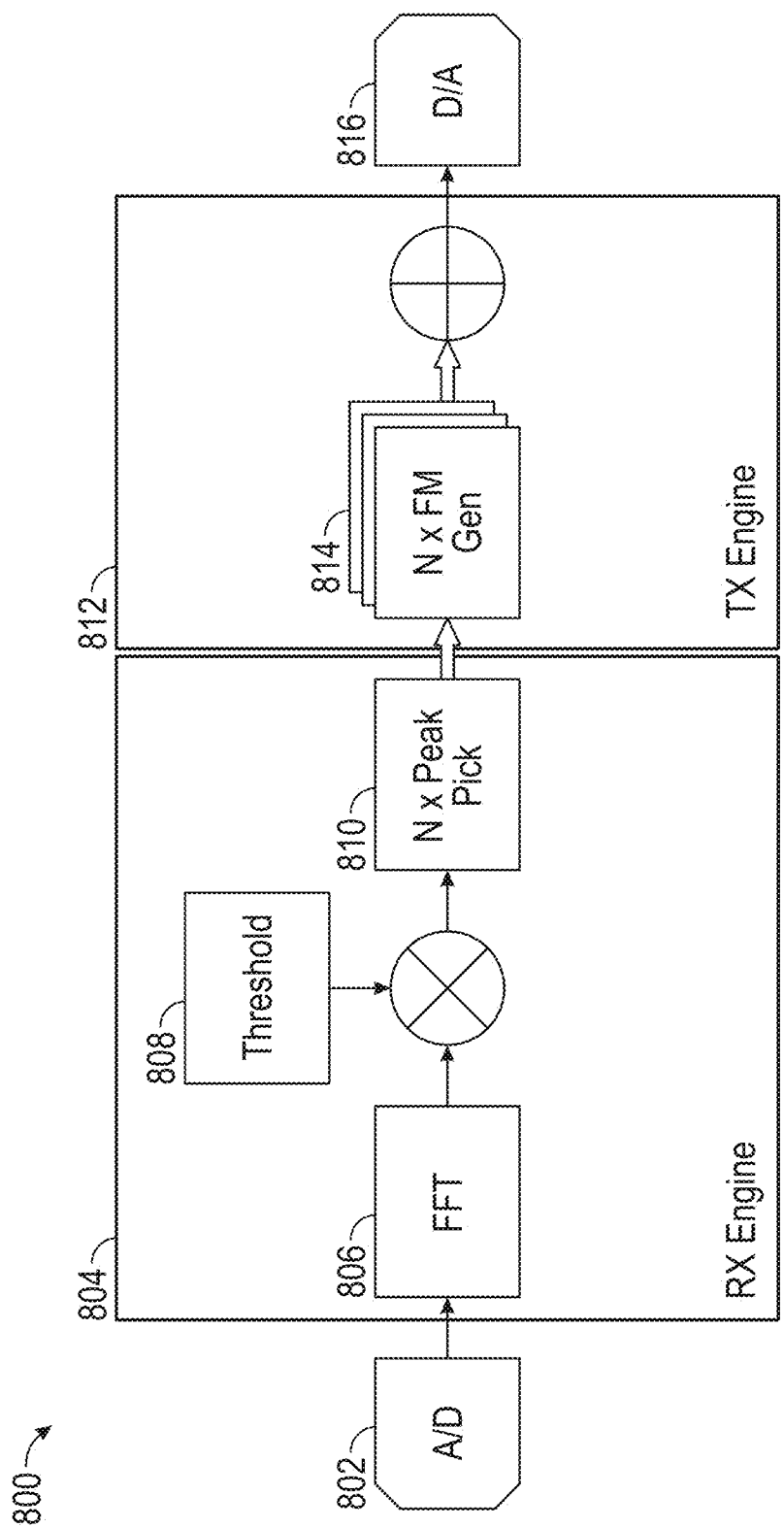
FIG. 8 depicts a block diagram of a system for receiving and transmitting signals.

Turning to FIG. 8, a block diagram of a system 800 for receiving and transmitting signals is illustrated. The system 800 can be configured to reactively disrupt a signal source based on real-time FFTs and identified signal characteristics determined by the above-described signal processing techniques. The system 800 is capable of delivering sub-millisecond jamming with a low Size, Weight, and Power (SWaP) profile. The system 800 can produce reactive jamming by detecting and responding to signals within single-digit microseconds, providing rapid reaction and low latency. Additionally, sinusoidal frequency modulation (FM) can reduce detection and geolocation risks, while being coupled with additional obfuscation layers with novel signal processing techniques.

In the illustrative embodiment, the analog-to-digital converter (A/D) 802 converts the analog signal received by the antenna into a digital signal. The signal receiving engine 804 receives the digitized signal, where a FFT 806 converts the signal from the time domain to the frequency domain. A threshold 808 is applied to the FFT 806 to filter out noise and isolate the desired signal. The threshold 808 can be defined by the user or based on a predefined dataset. An N×Peak Pick block 810 selects the N strongest frequency components from the threshold FFT output, which enables focusing on prominent signals in the spectrum.

A transmission signal can be generated in the signal transmission engine 812. An N×FM Gen block 814 generates N frequency modulated (FM) signals based on the selected frequencies from the peak picking stage 810. Each FM signal corresponds to one of the N strongest frequency components. A mixer can combine the n FM signals to create a single signal that contains all the selected frequency components. The digital-to-analog converter 816 converts the signal to an analog signal, which is amplified and transmitted through an antenna.

Figure 9:
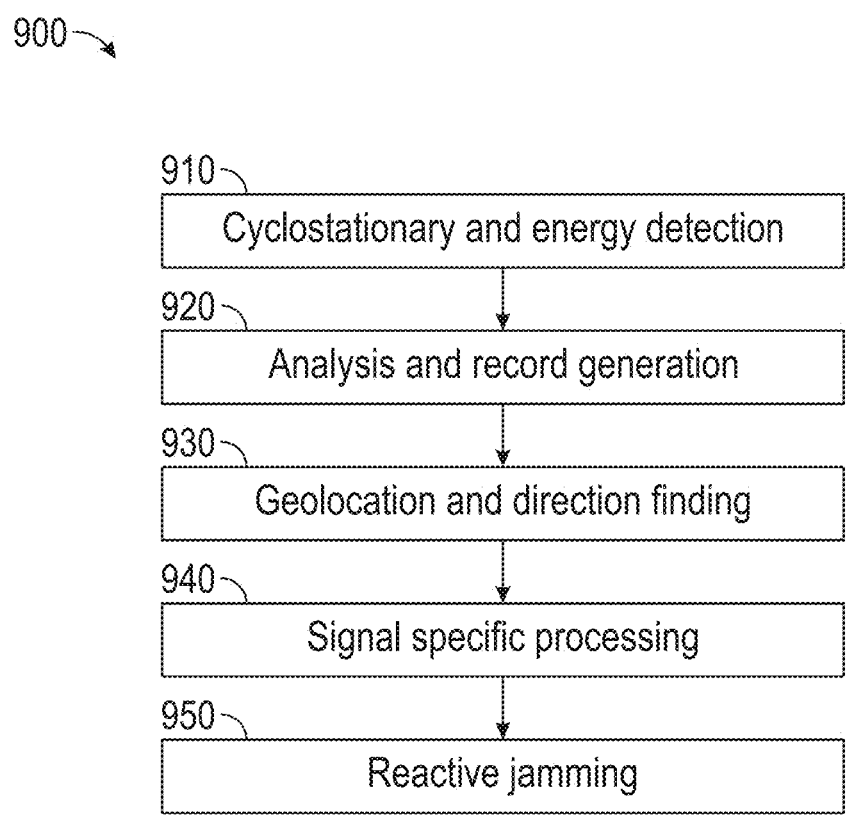
FIG. 9 depicts a flowchart of a signal processing implementation.

Turning to FIG. 9, a flowchart of a signal processing implementation 900 is depicted. The signal processing implementation 900 begins at step 910, where the system performs a blind detection and captures signals and detects cyclostationary characteristics and energy characteristics from the signals. The blind detections are then compared to a database of known signals, which are then assigned an identification for signals that are known (i.e., stored in the database) at step 920. Any unknown, non-commercial, or anomalous detection events can be flagged for further review or analysis. Based on the system's analysis of the signals, geolocation and direction finding techniques are performed for all signals of interest at step 930. At step 940, the system performs the above-disclosed signal processing techniques to identify the data within the signals. For example, the disclosed signal processing techniques can be used to identify data within specific signal types, such as WiFi processing or unmanned aerial system (UAS) processing. After the system has identified the data within the signals, the system can be configured to transmit signals to disrupt the detected signal source at step 950.

Example Recording Method

Figure 13:
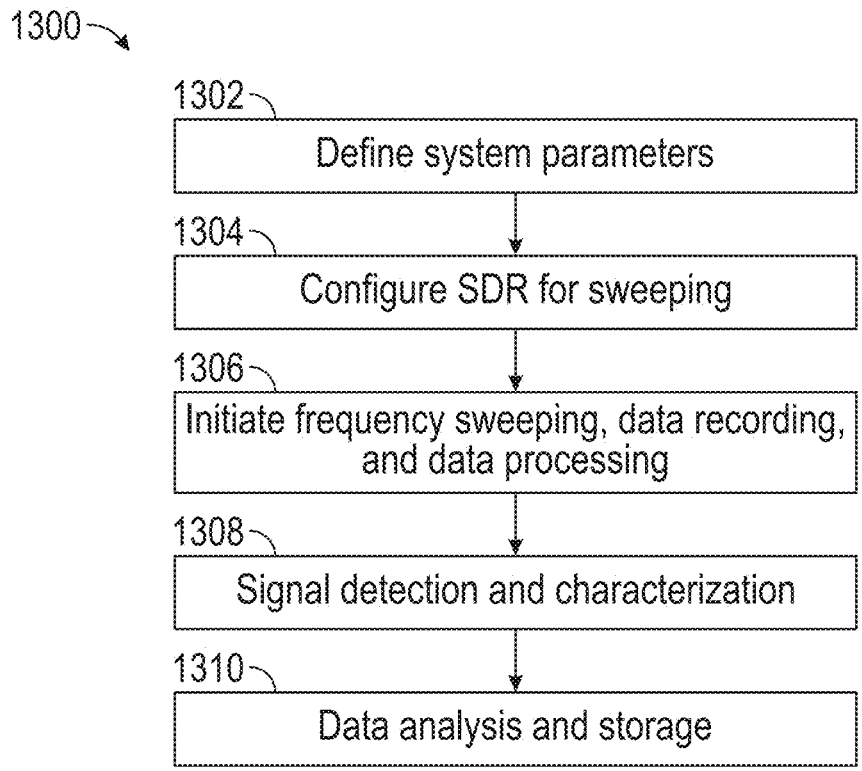
FIG. 13 depicts a flowchart of a dynamic sweeping process.

The disclosed systems can be configured for dynamic frequency sweeping. With reference to FIG. 13, a flowchart of a dynamic sweeping process 1300 is depicted. The process 1300 begins at step 1302, where the user can define the frequency range to be swept (e.g., the lower limit and the upper limit), set the step size for the frequency increments, and configure the dwell time for each frequency step. In some embodiments, the user can blackout certain frequency bands for the system to avoid sweeping. At step 1304 the processor transmits commands to the SDR for sweeping operations. For example, the processor can utilize a hardware control system that interfaces with the SDR, ensuring accurate execution of the frequency steps and dwell times (e.g., pause at specific center frequencies for a dwell time). The process 1300 proceeds to step 1306 where the SDR incrementally sweeps through the specified frequency ranges and pauses (or dwells) at each center frequency for the predefined dwell time. During each dwell, the captured IQ data is recorded. The processor can buffer the recorded IQ data for subsequent processing. For example, at each frequency step, after the system investigates a given frequency band, the processor performs real-time cyclostationary analysis and PSD calculations on the data.

The step and dwell functions can utilize an overlap in the frequency bands being analyzed to ensure a thorough and accurate analysis of the entire specified frequency range. The overlapping frequency bands advantageously ensure that there are no gaps in the spectrum coverage, which provides a comprehensive spectrum monitoring and analysis. Furthermore, hardware limitations or variations can cause slight inaccuracies in frequency tuning, and overlapping frequency bands mitigate the risk of missing signals. Overlapping frequency bands also enhance the detection of signals that might be on the edge of two frequency bands. Data quality is also improved by overlapping frequency bands. For example, overlapping bands provide redundant data, which can be useful in verifying the accuracy of the signal processing and analysis.

At step 1308, the system identifies in real-time the cyclic features and power characteristics of signals within the band, allowing the system to detect and characterize active signals. Steps 1306 and 1308 are repeated until the upper limit of the frequency range is completed. At step 1310, the processed data and analysis are stored in a database, allowing the results to be further analyzed for further signal detection and classification.

Advantageously, the disclosed process enables efficient and precise acquisition of signal data across a wide frequency range, enhancing the detection and classification of signals even in challenging environments with low signal-to-noise ratios.

Example Long-Term Spectrum Monitoring

Figure 14:
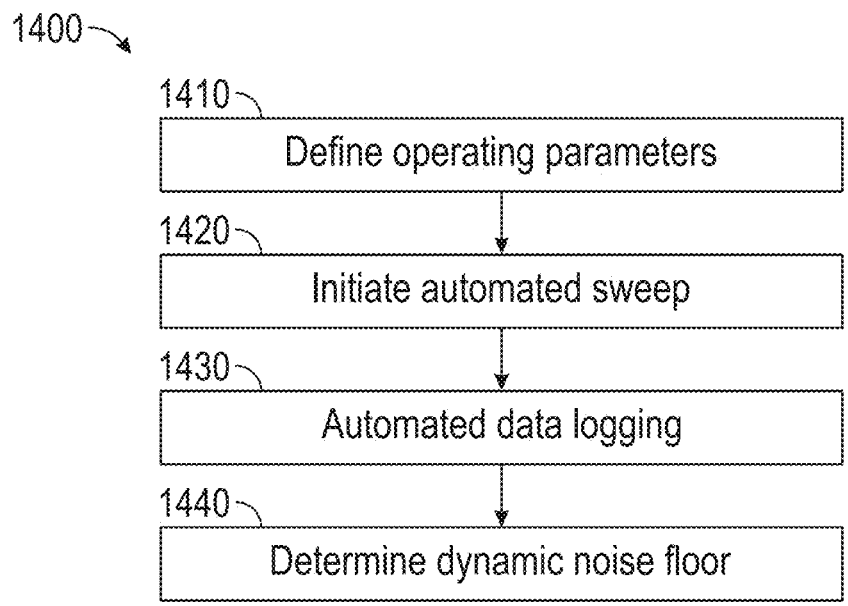
FIG. 14 depicts a flowchart of an autopilot function.

The disclosed systems can be configured to operate in an autopilot function that enables long-term spectrum monitoring and real-time analysis. With reference to FIG. 14, a flowchart of an autopilot function 1400 is depicted. The process 1400 begins at step 1410 where the predefined parameters are set. For example, the user can configure the minimum and maximum frequencies to be analyzed, set the frequency step size, define the cyclic processing parameters, and specify the recording duration.

At step 1420, an automated sweep is executed by the system. The system can sweep in a blind survey mode and perform a dedicated survey mode. The dedicated survey mode is typically performed after the blind survey mode. The blind survey mode includes the system sweeping through the defined frequency range using a step-and-dwell technique that is optimized for an SDR. The user can configure operating parameters such as the step size and dwell time. The step size parameter is hardware-dependent (e.g., receiver bandwidth, processing speed, buffer capacity), whereas the dwell time is dependent on the cyclostationary signal processing requirements (e.g., cycle rate of signals of interest, signal modulation, data volume). Under the blind survey mode, the system conducts a preliminary wideband survey to detect energy signals and cyclic features indicative of signal presence (e.g., active bands). The system utilizes cyclic and energy-based features for real-time signal identification. The disclosed cyclostationary algorithms are implemented to produce efficient and accurate processing. The system marks the active bands for subsequent dedicated survey and recording steps. The system also provides a preliminary electromagnetic spectrum fingerprint, including survey time determined by step size, frequency range, and cyclostationary alpha rates. The dedicated survey mode focuses on recording and analyzing active bands identified during the blind survey. The system utilizes the user-defined recording durations to facilitate extended data capture for post-mission signal analysis and exploitation.

At step 1430, the system logs the detected events into a database. The system proceeds to step 1440, where the system dynamically calculates and adjusts for the noise floor during each dwell event. The system compensates for any hardware imperfections (or limitations) and environmental variations to maintain performance. The system establishes a baseline noise profile across the frequency band being analyzed for enhanced signal detection.

The process 1400 advantageously enables users to perform long-term spectrum monitoring for intermittent signals and trends. The system also provides the benefit of characterizing complex electromagnetic environments without requiring operator intervention. Furthermore, the process 1400 enables the system to provide a unique temporal representation of spectrum activity.

Example Dedicated Survey Monitoring

Figure 15:
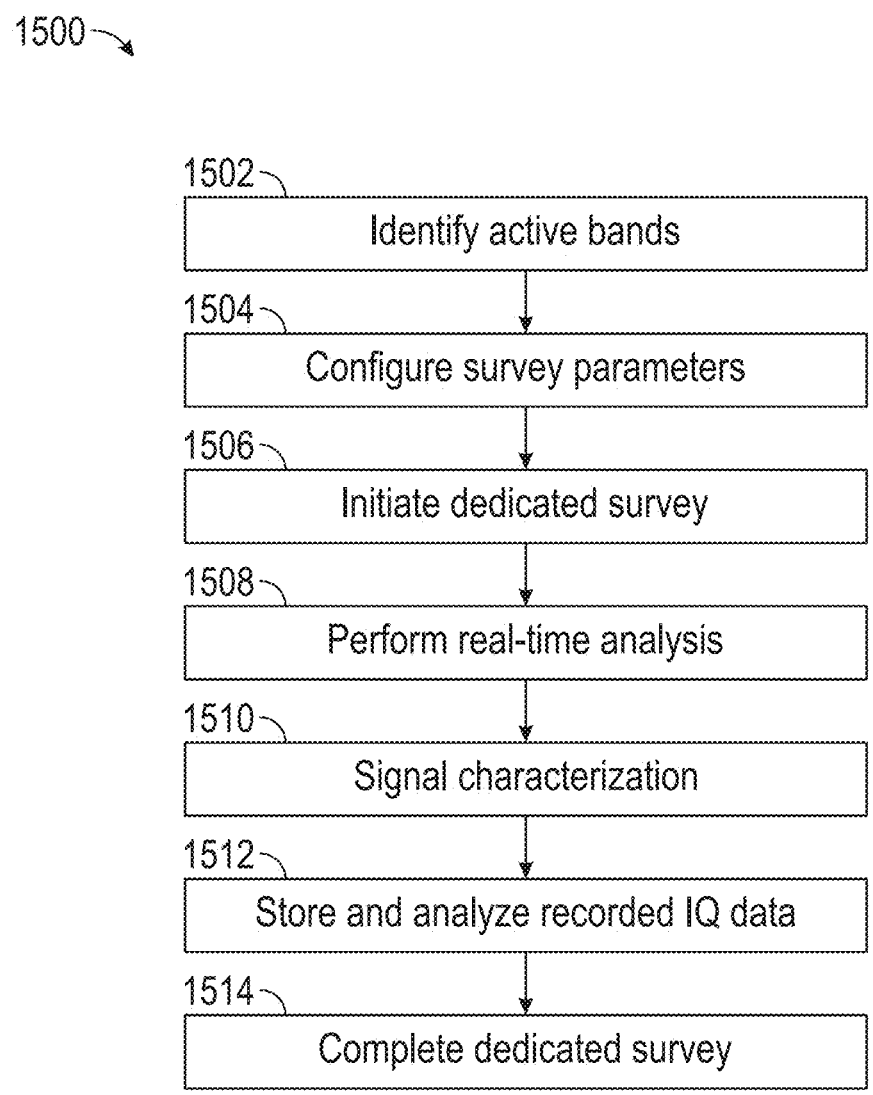
FIG. 15 depicts a flowchart of a dedicated monitoring technique.

After conducting one blind sweep (e.g., process 1400), the system can perform a dedicated survey, where signals are identified that exist in the bands. Turning to FIG. 15, a flowchart of a dedicated monitoring technique 1500 is illustrated. Beginning at step 1502, the system analyzes the results from the blind sweep to identify the active bands (e.g., frequency bands with detected signal activity). The system can provide a visual indicator of the active bands for further analysis. At step 1504, the survey parameters are established, including setting the recording duration for the identified bands. Continuing to step 1506, the system initiates the dedicated survey to the first identified active band and records the IQ data during the dwell time. The recorded IQ data is buffered in memory to ensure that no samples are lost. At step 1508, the system performs real-time cyclostationary analysis on the buffered IQ data and calculates the PSD for the frequency band. The process 1500 proceeds to step 1510 where the system identifies cyclic features and power characteristics of the signals within the band. The system characterizes and labels the detected signals based on the analysis. At step 1512, the system stores the recorded IQ data and analysis in a database, which facilitates easy retrieval and further analysis. Steps 1510-1512 are repeated for all active bands. At step 1514, the system completes the dedicated survey and uses the stored data for further detailed signal analysis. Additionally, the system can perform an additional processing to further characterize the signals. The process 1500 provides a thorough and focused analysis of the specific frequency bands and enhances the detection and characterization of the signals within those bands.

Example Coherent Subtraction Implementation

Figure 16:
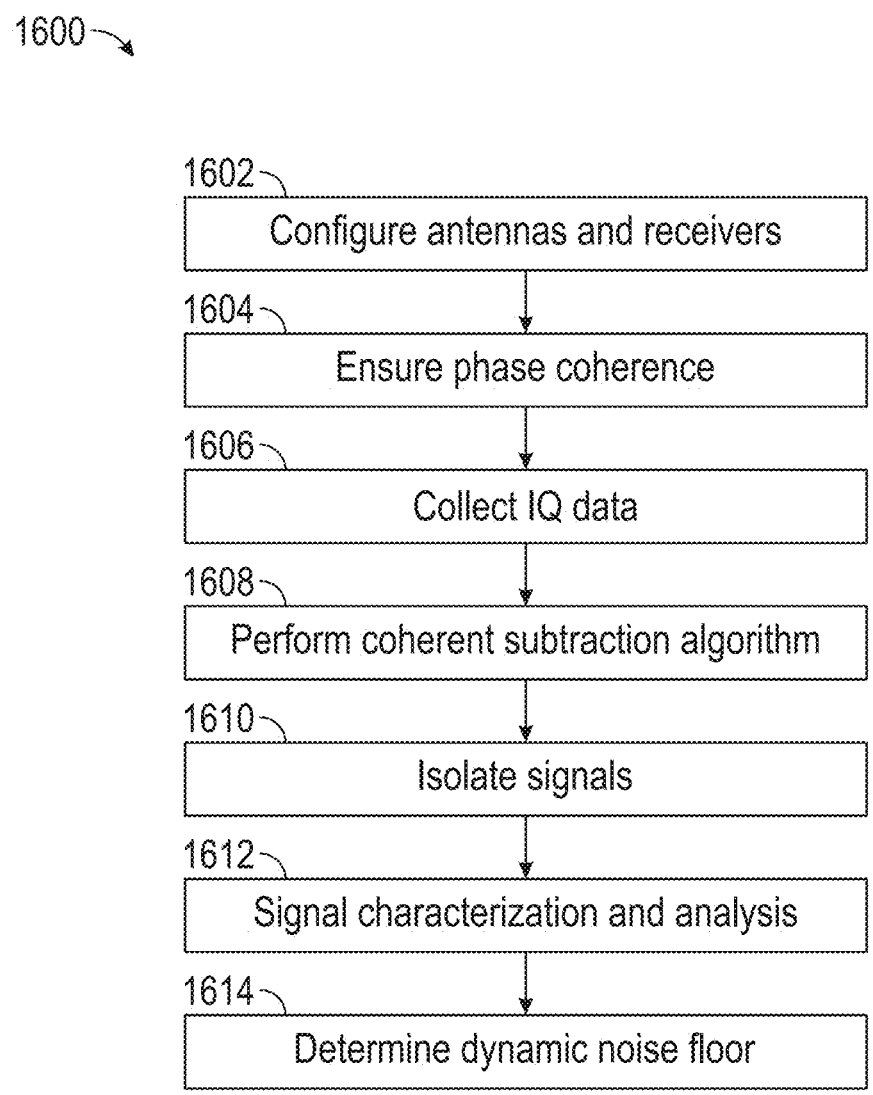
FIG. 16 depicts a flowchart of a coherent subtraction technique.

The disclosed systems can also be configured to implement a coherent subtraction technique to improve (or optimize) the isolation and characterization of signals of interest. Turning to FIG. 16, a flowchart of a coherent subtraction technique 1600 is depicted. The process 1600 begins at step 1602, where at least two antennas are set up. The first antenna is an omnidirectional antenna that is configured to capture background noise and environmental signals. The second antenna is a directional antenna configured to focus on the area (or device) of interest. The first antenna can be configured to connect to Channel 1 of a receiver and the second antenna can be configured to connect to Channel 2 of the receiver. At step 1604, the phase coherence is established. The two IQ data streams are synchronized in time and phase. Coherence can be achieved by sampling both streams using the same receiver or synchronizing multiple receivers using a shared clock or equivalent synchronization mechanism. Continuing to step 1606, IQ data is collected from Channel 1 (e.g., omnidirectional antenna) and Channel 2 (e.g., directional antenna). At step 1608, the system performs a coherent subtraction algorithm on the collected IQ data. The system subtracts the background noise captured by the omnidirectional antenna from the signals captured by the directional antenna. Continuing to step 1610, the system isolates the signals originating from the observed area by removing the background noise and environmental signals. At step 1612, the system characterizes and analyzes the isolated signals. The system performs the signal characterization without the need for RF anechoic chambers, which are hard to obtain, expensive, or logistically impractical. Proceeding to step 1614, the system dynamically calculates and adjusts the noise floor during each dwell event. The system compensates for hardware imperfections and environmental variations to maintain performance. The process 1600 can be used for long-term spectrum monitoring, characterization of complex electromagnetic environments, and temporal representation of spectrum activity. The process 1600 advantageously enables users to isolate and characterize signals of interest, even in complex and noisy environments.

For the purposes of the present disclosure, the term "a" or "an" entity refers to one or more of that entity. As such, the terms "a" or "an," "one or more," and "at least one" can be used interchangeably herein.

All numeric values herein are assumed to be modified by the term "about," whether or not explicitly indicated. For the purposes of the present invention, ranges may be expressed as from "about" one particular value to "about" another particular value. It will be understood that the endpoints of each of the ranges are significant both in relation to the other endpoint and independently of the other endpoint. When a value is expressed as an approximation by use of the antecedent "about," it will be understood that the particular value forms another embodiment.

Additionally, the section headings herein are provided for consistency with the suggestions under 37 C.F.R. § 1.77 or to provide organizational cues. These headings shall not limit or characterize the invention(s) set out in any claims that may issue from this disclosure. Specifically, and by way of example, although the headings refer to a "Technical Field," the claims should not be limited by the language chosen under this heading to describe the so-called field. Further, a description of a technology as background information is not to be construed as an admission that particular technology is prior art to any embodiment(s) in this disclosure. Neither is the "Summary" a characterization of the embodiment(s) outlined in issued claims.

Furthermore, any reference in this disclosure to "invention" in the singular should not be used to argue that there is only a single point of novelty in this disclosure. Multiple embodiments may be set forth according to the limitations of the multiple claims issuing from this disclosure. Such claims accordingly define the embodiment(s) and their equivalents that are protected thereby. In all instances, the scope of such claims shall be considered on their own merits in light of this disclosure but should not be constrained by the headings set forth herein.

Moreover, the Abstract is provided to comply with 37 C.F.R. § 1.72 (b), requiring an abstract that will allow the reader to quickly ascertain the nature of the technical disclosure. It is submitted with the understanding that it will not be used to interpret or limit the scope or meaning of the claims. In addition, in the preceding Detailed Description, it can be seen that various features may be grouped in a single embodiment to streamline the disclosure. This method of disclosure is not to be interpreted as reflecting an intention that the claimed embodiments require more features than are expressly recited in each claim. Instead, as the claims reflect, the inventive subject matter lies in less than all features of a single disclosed embodiment. Thus, the following claims are incorporated into the Detailed Description, with each claim standing on its own as a separate embodiment.

What is claimed is:

1. A system for detecting and identifying signals in real-time, the system comprising:
   one or more antennas for capturing electromagnetic signals;
   an analog-to-digital converter (ADC) in communication with the one or more antennas and configured to convert the captured electromagnetic signals into digital signals, wherein the digital signals comprise IQ data;
   one or more databases comprising stored signal data and/or associated parametrics; and
   a processor in communication with the ADC and the one or more databases, wherein the processor is configured to:

dynamically cause the one or more antennas to incrementally sweep through a predefined frequency range to capture electromagnetic signals, wherein the incremental sweep comprises a plurality of bands having a predefined step size, and wherein the incremental sweep comprises a predefined dwell time for each band of the plurality of bands;

perform a Fast Fourier Transform (FFT) on the digital signals to determine energy characteristics of the digital signals;

compare the energy characteristics with the stored signal data stored in the one or more databases;

buffer, simultaneously with performing the FFT and comparing the energy characteristics, the IQ data of the digital signals to produce a buffered digital signal set, wherein the IQ data is buffered for a predefined period of time;

channelize, simultaneously with performing the FFT and comparing the energy characteristics, the buffered digital signal set to produce a plurality of buffered digital signal sets;

perform, simultaneously with performing the FFT and comparing the energy characteristics, a cyclostationary algorithm on the plurality of buffered digital signal sets to detect cyclic characteristics of the digital signals;

compare, simultaneously with performing the FFT and comparing the energy characteristics, the cyclic characteristics with the stored signal data stored in the one or more databases;

identify the digital signals based on the comparisons of the energy characteristics and cyclic characteristics with the stored signal data; and display the identified digital signals on a graphic user interface.

2. The system of claim 1, wherein the predefined period of time is based on cyclic parameters of the electromagnetic signals within the predefined frequency range.

3. The system of claim 2, wherein the digital signals are buffered in Random Access Memory.

4. The system of claim 1, wherein after performing the FFT on the digital signals, the processor is configured to detect, identify, and display the energy characteristics on the graphic user interface.

5. The system of claim 1, wherein after performing the cyclostationary algorithm on the plurality of buffered digital signal sets, the processor is configured to display the cyclic characteristics on the graphic user interface.

6. The system of claim 1, wherein after performing the FFT on the digital signals, the processor is configured to store the energy samples in the one or more databases, and wherein after performing the cyclostationary algorithm on the plurality of buffered digital signal sets, the processor is configured to store the cyclic samples in the one or more databases.

7. The system of claim 1, wherein the one or more antennas are configured to capture samples of radio frequencies between 20 MHz and 43.5 GHz.

8. The system of claim 1, wherein the one or more antennas include a directional antenna and an omnidirectional antenna configured for direction finding, wherein the processor performs a coherent subtraction algorithm to locate signals of interest.

9. The system of claim 8, wherein the directional antenna is configured to capture signals of radio frequencies between 250 MHz and 26 GHz, and wherein the omnidirectional antenna is configured to capture signals of radio frequencies between 20 MHz and 43.5 GHz.

10. The system of claim 1, wherein the processor is further configured to perform a geolocation algorithm to identify a location of the identified signals, wherein the geolocation algorithm includes time-difference-of-arrival geolocation, frequency-difference-of-arrival geolocation, angle of arrival geolocation, or any combination thereof.

11. The system of claim 1, wherein the energy characteristics and cyclic characteristics are combined and simultaneously compared with the stored signal data stored in the one or more databases.

12. The system of claim 1, wherein dynamically causing the one or more antennas to incrementally sweep through the predefined frequency range includes automatically determining a dynamic noise floor of the captured electromagnetic signals having radio frequency (RF) activity during an initial sweep.

13. The system of claim 12, wherein after the initial sweep, the processor is further configured to:
   (a) perform the cyclostationary algorithm on the plurality of buffered digital signal sets of a first band to detect cyclic characteristics of the digital signals;
   (b) perform the FFT on the digital signals of the first band to determine energy characteristics of the digital signals;
   (c) store the IQ data of the first band in the one or more databases; and
   repeat (a)-(c) for each subsequent band.

14. The system of claim 1, wherein the processor is further configured to perform heuristic match based on the energy characteristics and/or the cyclic characteristics of the digital signals that do not match with the stored signal data, and wherein the processor stores the digital signals that do not match with the stored signal data in the one or more databases.

15. The system of claim 8, wherein the processor is further configured to cause the one or more antennas to transmit a disruption signal to disrupt the signal of interest, wherein the disruption signal includes a frequency modulation signal, a replay signal, a surrogate signal, or a custom signal.

16. A non-transitory computer readable medium for storing instructions that when executed by one or more processors cause the one or more processors to:
   dynamically cause one or more antennas to incrementally sweep through a predefined frequency range to capture electromagnetic signals, wherein the incremental sweep comprises a plurality of bands having a predefined step size, and wherein the incremental sweep comprises a predefined dwell time for each band of the plurality of bands;
   cause a software defined radio (SDR) to convert the captured electromagnetic signals into digital signals, wherein the digital signals comprise IQ data;
   perform a Fast Fourier Transform (FFT) on captured digital signals to determine energy characteristics of the digital signals;
   compare the energy characteristics with the stored signal data stored in one or more databases;
   buffer, simultaneously with performing the FFT and comparing the energy characteristics, the IQ data of the digital signals to produce a buffered digital signal set, wherein the IQ data is buffered for a predefined period of time, and wherein the IQ data is buffered in Random Access Memory;

channelize, simultaneously with performing the FFT and comparing the energy characteristics, the buffered digital signal set to produce a plurality of buffered digital signal sets;

perform, simultaneously with performing the FFT and comparing the energy characteristics, a cyclostationary algorithm on the plurality of buffered digital signal sets to detect cyclic characteristics of the digital signals;

compare, simultaneously with performing the FFT and comparing the energy characteristics, the cyclic characteristics with the stored signal data stored in the one or more databases;

identify the digital signals based on the comparisons of the energy characteristics and cyclic characteristics with the stored signal data; and display the identified digital signals on a graphic user interface.

17. The non-transitory computer readable medium of claim 16, wherein the predefined period of time is based on cyclic parameters of the electromagnetic signals within the predefined frequency range.

18. The non-transitory computer readable medium of claim 17, wherein dynamically causing the one or more antennas to incrementally sweep through the predefined frequency range includes automatically determining a dynamic noise floor of the captured electromagnetic signals having radio frequency (RF) activity during an initial sweep.

19. The non-transitory computer readable medium of claim 18, wherein after the initial sweep, the one or more processors are configured to:
(a) perform the cyclostationary algorithm on the plurality of buffered digital signal sets of a first band to detect cyclic characteristics of the digital signals;
(b) perform the FFT on the digital signals of the first band to determine energy characteristics of the digital signals;
(c) store the IQ data of the first band in the one or more databases; and
repeat (a)-(c) for each subsequent band.

20. The non-transitory computer readable medium of claim 19, wherein the one or more processors are further configured to perform heuristic match based on the energy characteristics and/or the cyclic characteristics of the digital signals that do not match with the stored signal data, and wherein the processor stores the digital signals that do not match with the stored signal data in the one or more databases.

\* \* \* \* \*